United States Patent
Sundaram et al.

(10) Patent No.: US 9,454,434 B2
(45) Date of Patent: Sep. 27, 2016

(54) FILE SYSTEM DRIVEN RAID REBUILD TECHNIQUE

(71) Applicant: NetApp, Inc., Sunnyvale, CA (US)

(72) Inventors: Rajesh Sundaram, Mountain View, CA (US); Bharat Baddepudi, San Jose, CA (US); Jeffrey S. Kimmel, Chapel Hill, NC (US); T. Byron Rakitzis, Seattle, WA (US)

(73) Assignee: NetApp, Inc., Sunnyvale, CA (US)

( * ) Notice: Subject to any disclaimer, the term of this patent is extended or adjusted under 35 U.S.C. 154(b) by 236 days.

(21) Appl. No.: 14/158,448

(22) Filed: Jan. 17, 2014

(65) Prior Publication Data

US 2015/0205668 A1      Jul. 23, 2015

(51) Int. Cl.
*G06F 11/10* (2006.01)
*G06F 3/06* (2006.01)

(52) U.S. Cl.
CPC ......... *G06F 11/1096* (2013.01); *G06F 3/0689* (2013.01); *G06F 11/108* (2013.01); *G06F 11/1008* (2013.01); *G06F 11/1076* (2013.01); *G06F 11/1084* (2013.01); *G06F 11/1092* (2013.01); *G06F 2211/1057* (2013.01)

(58) Field of Classification Search
CPC ........... G06F 11/1084; G06F 11/1092; G06F 11/1096
See application file for complete search history.

(56) References Cited

U.S. PATENT DOCUMENTS

| | | | |
|---|---|---|---|
| 5,937,425 A | 8/1999 | Ban | |
| 6,219,800 B1 | 4/2001 | Johnson et al. | |
| 6,704,839 B2 | 3/2004 | Butterworth et al. | |
| 7,055,058 B2 * | 5/2006 | Lee et al. | 714/6.32 |
| 7,249,150 B1 | 7/2007 | Watanabe et al. | |
| 7,680,837 B2 | 3/2010 | Yamato | |
| 7,996,636 B1 | 8/2011 | Prakash et al. | |
| 8,082,390 B1 | 12/2011 | Fan et al. | |
| 8,099,396 B1 | 1/2012 | Novick et al. | |
| 8,131,926 B2 * | 3/2012 | Lubbers et al. | 711/114 |
| 8,140,860 B2 | 3/2012 | Haswell | |
| 8,156,290 B1 * | 4/2012 | Vanninen et al. | 711/154 |

(Continued)

FOREIGN PATENT DOCUMENTS

| | | |
|---|---|---|
| EP | 0726521 A2 | 8/1996 |
| WO | WO-2006/050455 A2 | 5/2006 |
| WO | WO-2008/070173 A1 | 6/2008 |

OTHER PUBLICATIONS

Cornwall, Michael, "Anatomy of a Solid-state Drive," ACM Queue—Networks, vol. 10, No. 10, Oct. 2012, pp. 1-7.

(Continued)

*Primary Examiner* — Gabriel Chu
*Assistant Examiner* — Paul Contino
(74) *Attorney, Agent, or Firm* — Cesari and McKenna, LLP

(57) ABSTRACT

In one embodiment, one or more storage arrays of solid state drives (SSDs) that include a plurality of segments are organized as one or more redundant array of independent disks (RAID) groups, where the RAID groups provides data redundancy for the segments. A node executing a layered file system of a storage input/output (I/O) stack performs segment cleaning to clean the segments. It further initiates rebuild of a RAID configuration of the SSDs on a segment-by-segment basis in response to the segment cleaning. In such a configuration, each segment includes one or more RAID stripes that provide a level of data redundancy as well as RAID organization for the segment.

20 Claims, 10 Drawing Sheets

(56) References Cited

U.S. PATENT DOCUMENTS

| | | | |
|---|---|---|---|
| 8,205,065 | B2 | 6/2012 | Matze |
| 8,341,457 | B2 | 12/2012 | Spry et al. |
| 8,417,987 | B1 | 4/2013 | Goel et al. |
| 8,495,417 | B2 | 7/2013 | Jernigan, IV et al. |
| 8,539,008 | B2 | 9/2013 | Faith et al. |
| 8,560,879 | B1 | 10/2013 | Goel |
| 8,589,625 | B2 | 11/2013 | Colgrove et al. |
| 8,595,595 | B1 | 11/2013 | Grcanac et al. |
| 8,732,426 | B2 | 5/2014 | Colgrove et al. |
| 8,775,868 | B2 | 7/2014 | Colgrove et al. |
| 8,832,363 | B1 | 9/2014 | Sundaram et al. |
| 8,832,373 | B2 | 9/2014 | Colgrove et al. |
| 8,839,008 | B2 | 9/2014 | Maniktala |
| 8,996,468 | B1 | 3/2015 | Mattox |
| 9,389,958 | B2 * | 7/2016 | Sundaram ........... G06F 11/1096 |
| 2003/0120869 | A1 | 6/2003 | Lee et al. |
| 2003/0191916 | A1 | 10/2003 | McBrearty et al. |
| 2005/0144514 | A1 | 6/2005 | Ulrich et al. |
| 2007/0143359 | A1 | 6/2007 | Uppala |
| 2009/0144497 | A1 * | 6/2009 | Withers ........................ 711/114 |
| 2010/0042790 | A1 | 2/2010 | Mondal et al. |
| 2010/0088296 | A1 | 4/2010 | Periyagaram et al. |
| 2011/0022778 | A1 * | 1/2011 | Schibilla ............. G06F 12/0246 711/103 |
| 2011/0035548 | A1 | 2/2011 | Kimmel et al. |
| 2011/0126045 | A1 | 5/2011 | Bennett |
| 2011/0213928 | A1 | 9/2011 | Grube et al. |
| 2012/0072680 | A1 | 3/2012 | Kimura et al. |
| 2012/0079318 | A1 | 3/2012 | Colgrove et al. |
| 2012/0084506 | A1 | 4/2012 | Colgrove et al. |
| 2012/0290788 | A1 | 11/2012 | Klemm et al. |
| 2013/0018854 | A1 | 1/2013 | Condict |
| 2013/0019057 | A1 | 1/2013 | Stephens |
| 2013/0138862 | A1 | 5/2013 | Motwani et al. |
| 2013/0173955 | A1 | 7/2013 | Hallak et al. |
| 2013/0238832 | A1 | 9/2013 | Dronamraju et al. |
| 2013/0238932 | A1 | 9/2013 | Resch |
| 2013/0268497 | A1 | 10/2013 | Baldwin et al. |
| 2013/0346810 | A1 | 12/2013 | Kimmel et al. |
| 2014/0149647 | A1 * | 5/2014 | Guo .......................... G06F 3/06 711/103 |
| 2014/0215129 | A1 | 7/2014 | Kuzmin et al. |
| 2014/0379965 | A1 | 12/2014 | Gole et al. |
| 2015/0193338 | A1 | 7/2015 | Sundaram et al. |
| 2015/0205663 | A1 | 7/2015 | Sundaram et al. |
| 2015/0339194 | A1 | 11/2015 | Kalos et al. |
| 2016/0179410 | A1 * | 6/2016 | Haas ...................... G06F 3/0619 714/6.24 |

OTHER PUBLICATIONS

"Cuckoo hashing," Wikipedia, http://en.wikipedia.org/wiki/Cuckoo_hash, Apr. 2013, pp. 1-5.

Culik, K., et al., "Dense Multiway Trees," ACM Transactions on Database Systems, vol. 6, Issue 3, Sep. 1981, pp. 486-512.

Debnath, Biplob, et al., "FlashStore:.High Throughput Persistent Key-Value Store," Proceedings of the VLDB Endowment VLDB Endowment, vol. 3, Issue 1-2, Sep. 2010, pp. 1414-1425.

Gal, Eran et al., "Algorithms and Data Structures for Flash Memories," ACM Computing Surveys, vol. 37, No. 2, Jun. 2005, pp. 138-163.

Gray, Jim et al., "Flash Disk Opportunity for Server Applications," Queue—Enterprise Flash Storage, vol. 6, Issue 4, Jul.-Aug. 2008, pp. 18-23.

Handy, Jim, "SSSI Tech Notes: How Controllers Maximize SSD Life," SNIA, Jan. 2013, pp. 1-20.

Leventhal, Adam H., "A File System All Its Own," Communications of the ACM Queue, vol. 56, No. 5, May 2013, pp. 64-67.

Lim, H. et al., "SILT: A Memory-Efficient, High-Performance Key-Value Store," Proceedings of the $23^{rd}$ ACM Symposium on Operating Systems Principles (SOSP'11), Oct. 23-26, 2011, pp. 1-13.

Moshayedi, Mark, et al., "Enterprise SSDs," ACM Queue—Enterprise Flash Storage, vol. 6 No. 4, Jul.-Aug. 2008, pp. 32-39.

Pagh, Rasmus, et al., "Cuckoo Hashing," Elsevier Science, Dec. 8, 2003, pp. 1-27.

Pagh, Rasmus, "Cuckoo Hashing for Undergraduates," IT University of Copenhagen, Mar. 27, 2006, pp. 1-6.

Rosenblum, Mendel, et al., "The Design and Implementation of a Log-Structured File System," Proceedings of the $13^{th}$ ACM Symposium on Operating Systems Principles, Jul. 24, 1991, pp. 1-15.

Rosenblum, Mendel, et al., "The LFS Storage Manager," Summer '90 USENIX Technical Conference, Anaheim, California, Jun. 1990, pp. 1-16.

Rosenblum, Mendel, "The Design and Implementation of a Log-structured File System," UC Berkeley, Thesis, 1992, pp. 1-101.

Seltzer, Margo, et al., "An Implementation of a Log Structured File System for UNIX," Winter USENIX, San Diego, CA, Jan. 25-29, 1993, pp. 1-18.

Seltzer, Margo, et al., "File System Performance and Transaction Support," UC Berkeley, Thesis, 1992, pp. 1-131.

Smith, Kent, "Garbage Collection," SandForce, Flash Memory Summit, Santa Clara, CA, Aug. 2011, pp. 1-9.

Twigg, Andy, et al., "Stratified B-trees and Versioned Dictionaries," Proceedings of the 3rd USENIX Conference on Hot Topics in Storage and File Systems, vol. 11, 2011, pp. 1-5.

Wu, Po-Liang, et al., "A File-System-Aware FTL Design for Flash-Memory Storage Systems," Design, Automation & Test in Europe Conference & Exhibition, IEEE, 2009, pp. 1-6.

"Notification of Transmittal of the International Search Report and the Written Opinion of the International Searching Authority, or the Declaration," International Filing Date: Dec. 19, 2014, International Application No. PCT/US2014/071635, Applicant: NETAPP, Inc., Date of Mailing: Mar. 31, 2015 (13 pages).

Wilkes, John, et al., "The HP AutoRAID hierarchical storage system," Operating System Review, ACM, New York, NY, vol. 29, No. 5, Dec. 1, 1995, pp. 96-108.

Hwang, Kai et al., "RAID-x: A New Distributed Disk Array for I/O-centric Cluster Computing", IEEE High-Performance Distributed Computing, Aug. 2000, pp. 279-286.

Ongaro, Diego et al., "In Search of an Understandable Consensus Algorithm," Stanford University, May 2013. Downloaded from https://ramcloud.stanford.edu/wiki/download/attachments/11370504/raft.pdf (14 pages).

* cited by examiner

… (1)

FILE SYSTEM DRIVEN RAID REBUILD TECHNIQUE

BACKGROUND

1. Technical Field

The present disclosure relates to storage systems and, more specifically, to RAID rebuild of storage devices of a storage system.

2. Background Information

A storage system typically includes one or more storage devices, such as solid state drives (SSDs) embodied as flash storage devices, into which information may be entered, and from which the information may be obtained, as desired. The storage system may implement a high-level module, such as a file system, to logically organize the information stored on the devices as storage containers, such as files or logical units (LUNs). Each storage container may be implemented as a set of data structures, such as data blocks that store data for the storage containers and metadata blocks that describe the data of the storage containers. For example, the metadata may describe, e.g., identify, storage locations on the devices for the data.

Some types of SSDs, especially those with NAND flash components, may include translation logic of an internal controller, i.e., a flash translation layer, which maintains reserve capacity (i.e., previously-erased or free blocks) in the flash components to implement log-structured layout within the devices. As used herein, log structured layout denotes sequential storage of data on SSD. The reserve capacity may include free blocks that were previously erased in accordance with a process referred to as garbage collection. The SSD controller implements garbage collection by moving valid data from old locations to new locations among those components at the granularity of a page (e.g., 8 Kbytes) and then only to previously-erased pages. Thereafter, the old locations where the pages were stored are freed, i.e., the pages are marked for deletion (or as invalid). Typically, the pages are erased exclusively in groups of blocks (e.g., 32 or more pages totaling 256 KB or more). Such garbage collection typically results in substantial write amplification in the system.

In addition, the "on-disk" layout of the data structures in the storage containers (i.e., on the SSDs) may create a plurality of odd-shaped random "hole" (i.e., deleted data) fragments adjacent to data. This fragmented data (i.e., data with interposed holes) may not facilitate natural alignment boundaries for Redundant Array of Independent Disk (RAID) configurations, thus raising problems for RAID implementations. For example, if an attempt is made to write data into the odd-shaped fragments, it may be difficult to achieve good RAID stripe efficiency because partial stripes may be written, causing increased write amplification due to increased parity overhead.

Yet another source of write amplification in the system may involve RAID-related operations. Assume a dual parity RAID configuration that may include a plurality of data SSDs and two parity SSDs. A random write operation that stores write data on a data SSD of a RAID stripe may result in a plurality of read-modify-write (RMW) operations that, e.g., updates the data SSD with write data and updates the two parity SSDs with parity information after reading a portion of the write data and/or parity information. Such RAID-related operations results in a substantial amount of write amplification to the system. In addition, a substantial read load may occur on the parity SSDs as data from random read operations are verified using the parity information stored on the parity SSDs (i.e., requiring access to parity information on the parity SSDs).

To reduce read load resulting from a RAID configuration, parity information may be distributed among the storage devices (e.g., RAID 5 "rotating parity"). However, this may result in further undesirable read and write amplification when adding or removing storage devices because the data and/or parity information are redistributed (i.e., moved) among a different group of storage devices when the RAID configuration changes (i.e., change to the distributed parity RAID configuration), so as to maintain a reduced read load. In addition, increased storage capacity from additional SSDs (i.e., adding storage) is usually not available for end-user access until redistribution of data and/or parity information is complete for the changed RAID configuration.

Therefore, it is desirable to provide a file system that reduces various sources of write amplification from a storage system while also diminishing read load on the storage devices of the storage system and supporting immediate end-user storage capacity changes when adding or removing storage devices, wherein the sources of write amplification and read load include 1) internal SSD garbage collection; 2) partial RAID stripe operations from fragmented data; 3) RMW operations from RAID organizations of data and parity; and 4) re-organization of RAID data and/or parity when storage devices change (i.e., added or removed storage devices).

BRIEF DESCRIPTION OF THE DRAWINGS

The invention description below refers to the accompanying drawings, of which.

DESCRIPTION OF ILLUSTRATIVE EMBODIMENTS

The embodiments described herein are directed to a file system driven RAID rebuild technique. A layered file system may organize storage of data as segments spanning one or more sets of storage devices, such as solid state drives (SSDs), of a storage array, wherein each set of SSDs may form a RAID group configured to provide data redundancy for a segment. The file system may then drive (i.e., initiate) rebuild of a RAID configuration of the SSDs on a segment-by-segment basis in response to cleaning of the segment (i.e., segment cleaning). That is, rebuild of the RAID configuration occurs in response to the file system operation of segment cleaning, rather than as an independent operation. Each segment may include one or more RAID stripes that provide a level of data redundancy (e.g., single parity RAID 5 or double parity RAID 6) as well as RAID organization (i.e., distribution of data and parity) for the segment. Notably, the level of data redundancy and RAID organization may differ among the segments of the array. Illustratively, the distribution of parity may occur by choosing different parity locations (i.e., SSDs) for different segments, rather than by distributing parity within each segment. That is, although fixed parity SSDs may be chosen for each segment (i.e., the same one or more SSDs may be used for parity and/or diagonal parity for the entire segment) different parity SSDs may be chosen for other segments. Accordingly, parity distribution (e.g., RAID 5, RAID 6) may be realized, but on a segment-by-segment basis with a fixed parity arrangement within each segment. Advantageously, the described file system RAID rebuild technique permits expanding capacity (i.e., adding storage capacity) to any segment without having to redistribute the parity information within that segment, because the expanded capacity may use the same fixed parity. The additional capacity may then be available for immediate use (i.e., no redistribution of parity is necessary).

Further, an available pool of storage for data includes all SSDs without requiring one or more dedicated spare SSDs, because redundancy (e.g., RAID level) may be degraded on a segment-by-segment basis, rather than all at once. New segments may be configured with the same redundancy, but from a smaller set of SSDs after failure of a SSD.

DESCRIPTION

Storage Cluster

Figure 1:
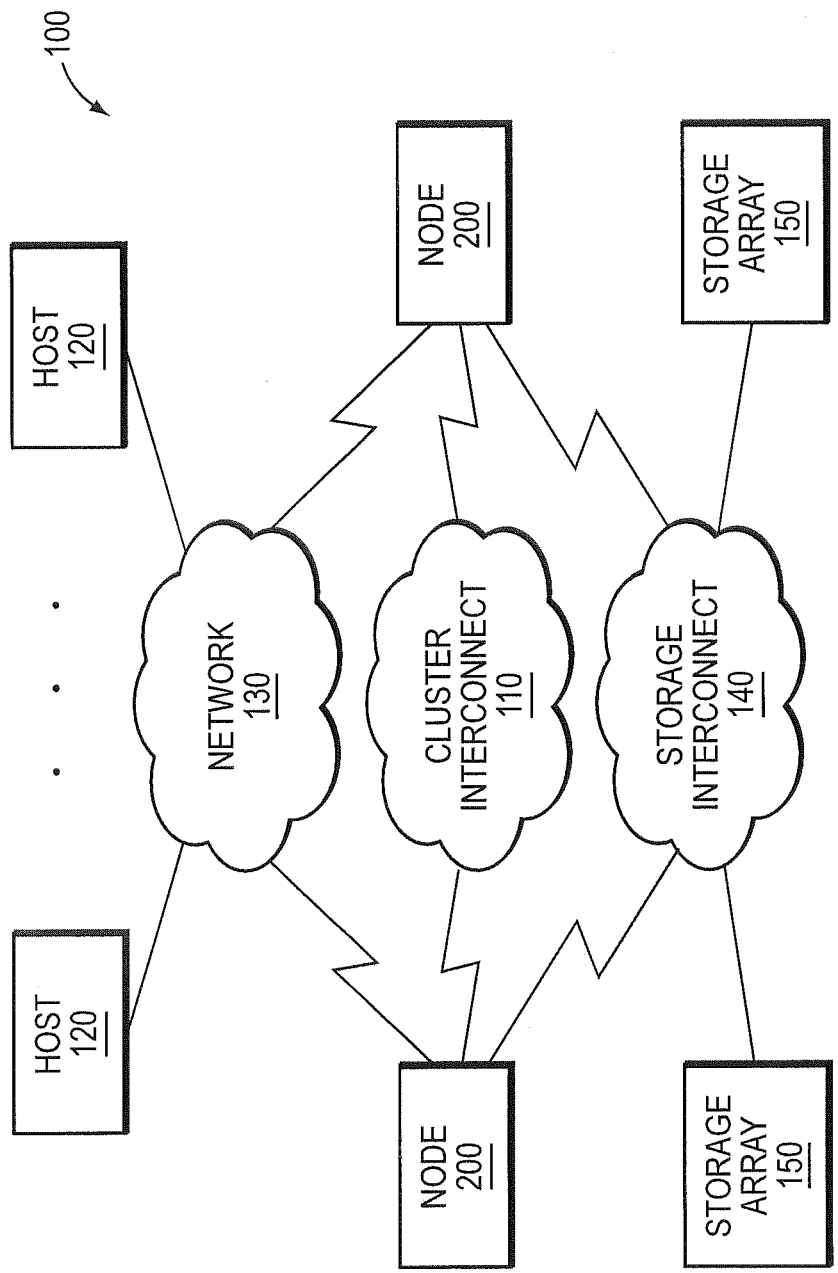
FIG. 1 is a block diagram of a plurality of nodes interconnected as a cluster.

FIG. 1 is a block diagram of a plurality of nodes 200 interconnected as a cluster 100 and configured to provide storage service relating to the organization of information on storage devices. The nodes 200 may be interconnected by a cluster interconnect fabric 110 and include functional components that cooperate to provide a distributed storage architecture of the cluster 100, which may be deployed in a storage area network (SAN). As described herein, the components of each node 200 include hardware and software functionality that enable the node to connect to one or more hosts 120 over a computer network 130, as well as to one or more storage arrays 150 of storage devices over a storage interconnect 140, to thereby render the storage service in accordance with the distributed storage architecture.

Each host 120 may be embodied as a general-purpose computer configured to interact with any node 200 in accordance with a client/server model of information delivery. That is, the client (host) may request the services of the node, and the node may return the results of the services requested by the host, by exchanging packets over the network 130. The host may issue packets including file-based access protocols, such as the Network File System (NFS) protocol over the Transmission Control Protocol/Internet Protocol (TCP/IP), when accessing information on the node in the form of storage containers such as files and directories. However, in an embodiment, the host 120 illustratively issues packets including block-based access protocols, such as the Small Computer Systems Interface (SCSI) protocol encapsulated over TCP (iSCSI) and SCSI encapsulated over FC (FCP), when accessing information in the form of storage containers such as logical units (LUNs). Notably, any of the nodes 200 may service a request directed to a storage container stored on the cluster 100.

Figure 2:
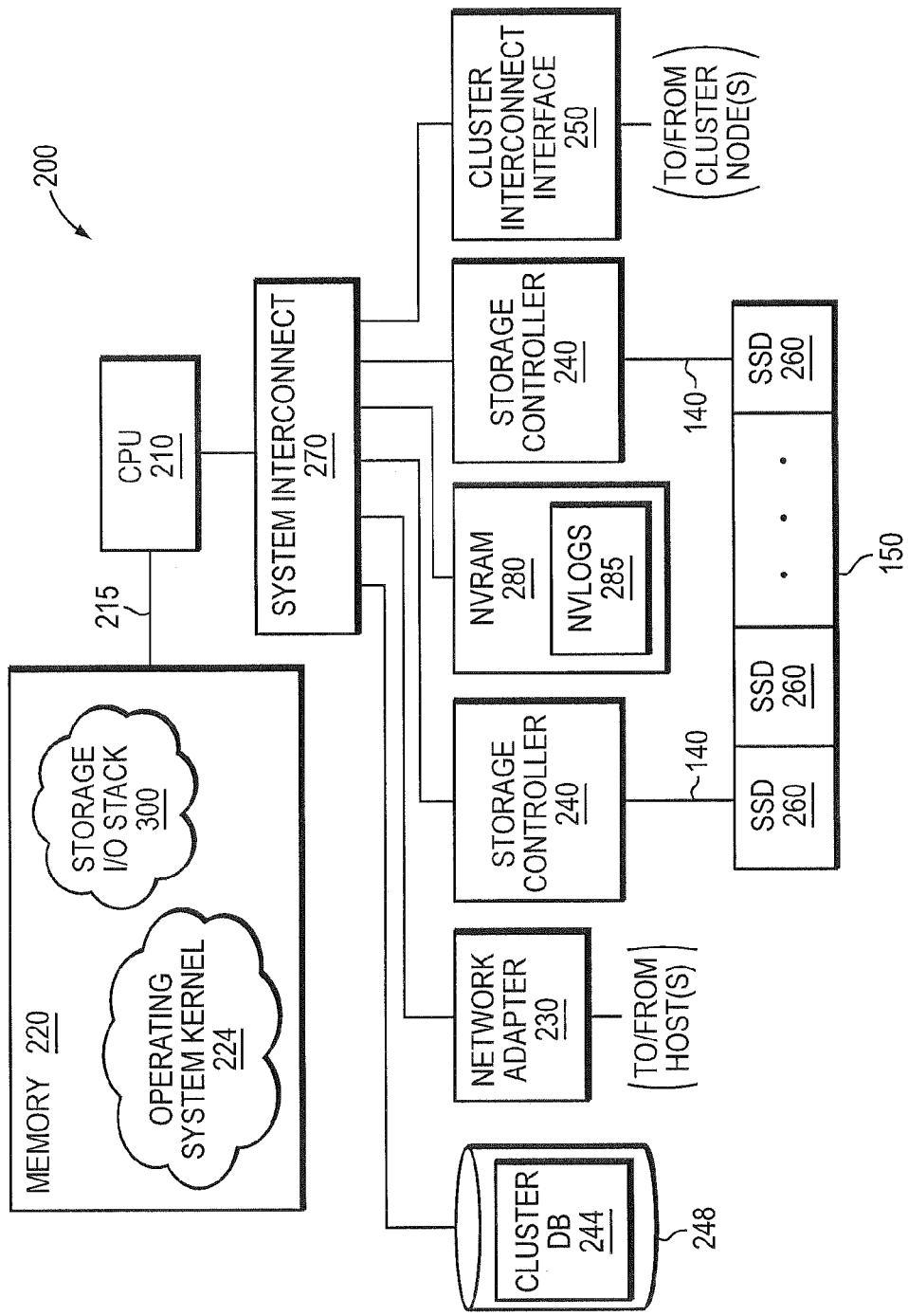
FIG. 2 is a block diagram of a node.

FIG. 2 is a block diagram of a node 200 that is illustratively embodied as a storage system having one or more central processing units (CPUs) 210 coupled to a memory 220 via a memory bus 215. The CPU 210 is also coupled to a network adapter 230, storage controllers 240, a cluster interconnect interface 250, and a non-volatile random access memory (NVRAM 280) via a system interconnect 270. The network adapter 230 may include one or more ports adapted to couple the node 200 to the host(s) 120 over computer network 130, which may include point-to-point links, wide area networks, virtual private networks implemented over a public network (Internet) or a local area network. The network adapter 230 thus includes the mechanical, electrical and signaling circuitry needed to connect the node to the network 130, which illustratively embodies an Ethernet or Fibre Channel (FC) network.

The memory 220 may include memory locations that are addressable by the CPU 210 for storing software programs and data structures associated with the embodiments described herein. The CPU 210 may, in turn, include processing elements and/or logic circuitry configured to execute the software programs, such as a storage input/output (I/O) stack 300, and manipulate the data structures. Illustratively, the storage I/O stack 300 may be implemented as a set of user mode processes that may be decomposed into a plurality of threads. An operating system kernel 224, portions of which are typically resident in memory 220 (in-core) and executed by the processing elements (i.e., CPU 210), functionally organizes the node by, inter alia, invoking operations in support of the storage service implemented by the node and, in particular, the storage I/O stack 300. A suitable operating system kernel 224 may include a general-purpose operating system, such as the UNIX® series or Microsoft Windows® series of operating systems, or an operating system with configurable functionality such as microkernels and embedded kernels. However, in an embodiment described herein, the operating system kernel is illustratively the Linux® operating system. It will be apparent to those skilled in the art that other processing and memory means, including various computer readable media, may be used to store and execute program instructions pertaining to the embodiments herein.

Each storage controller 240 cooperates with the storage I/O stack 300 executing on the node 200 to access information requested by the host 120. The information is preferably stored on storage devices such as solid state drives (SSDs) 260, illustratively embodied as flash storage devices, of storage array 150. In an embodiment, the flash storage devices may be based on NAND flash components, e.g., single-layer-cell (SLC) flash, multi-layer-cell (MLC) flash or triple-layer-cell (TLC) flash, although it will be understood to those skilled in the art that other non-volatile, solid-state electronic devices (e.g., drives based on storage class memory components) may be advantageously used with the embodiments described herein. Accordingly, the storage devices may or may not be block-oriented (i.e., accessed as blocks). The storage controller 240 includes one or more ports having I/O interface circuitry that couples to the SSDs 260 over the storage interconnect 140, illustratively embodied as a serial attached SCSI (SAS) topology. Alternatively, other point-to-point I/O interconnect arrangements, such as a conventional serial ATA (SATA) topology or a PCI topology, may be used. The system interconnect 270 may also couple the node 200 to a local service storage device 248, such as an SSD, configured to locally store cluster-related configuration information, e.g., as cluster database (DB) 244, which may be replicated to the other nodes 200 in the cluster 100.

The cluster interconnect interface 250 may include one or more ports adapted to couple the node 200 to the other node(s) of the cluster 100. In an embodiment, Ethernet may be used as the clustering protocol and interconnect fabric media, although it will be apparent to those skilled in the art that other types of protocols and interconnects, such as Infiniband, may be utilized within the embodiments described herein. The NVRAM 280 may include a back-up battery or other built-in last-state retention capability (e.g., non-volatile semiconductor memory such as storage class memory) that is capable of maintaining data in light of a failure to the node and cluster environment. Illustratively, a portion of the NVRAM 280 may be configured as one or more non-volatile logs (NVLogs 285) configured to temporarily record ("log") I/O requests, such as write requests, received from the host 120.

Storage I/O Stack

Figure 3:
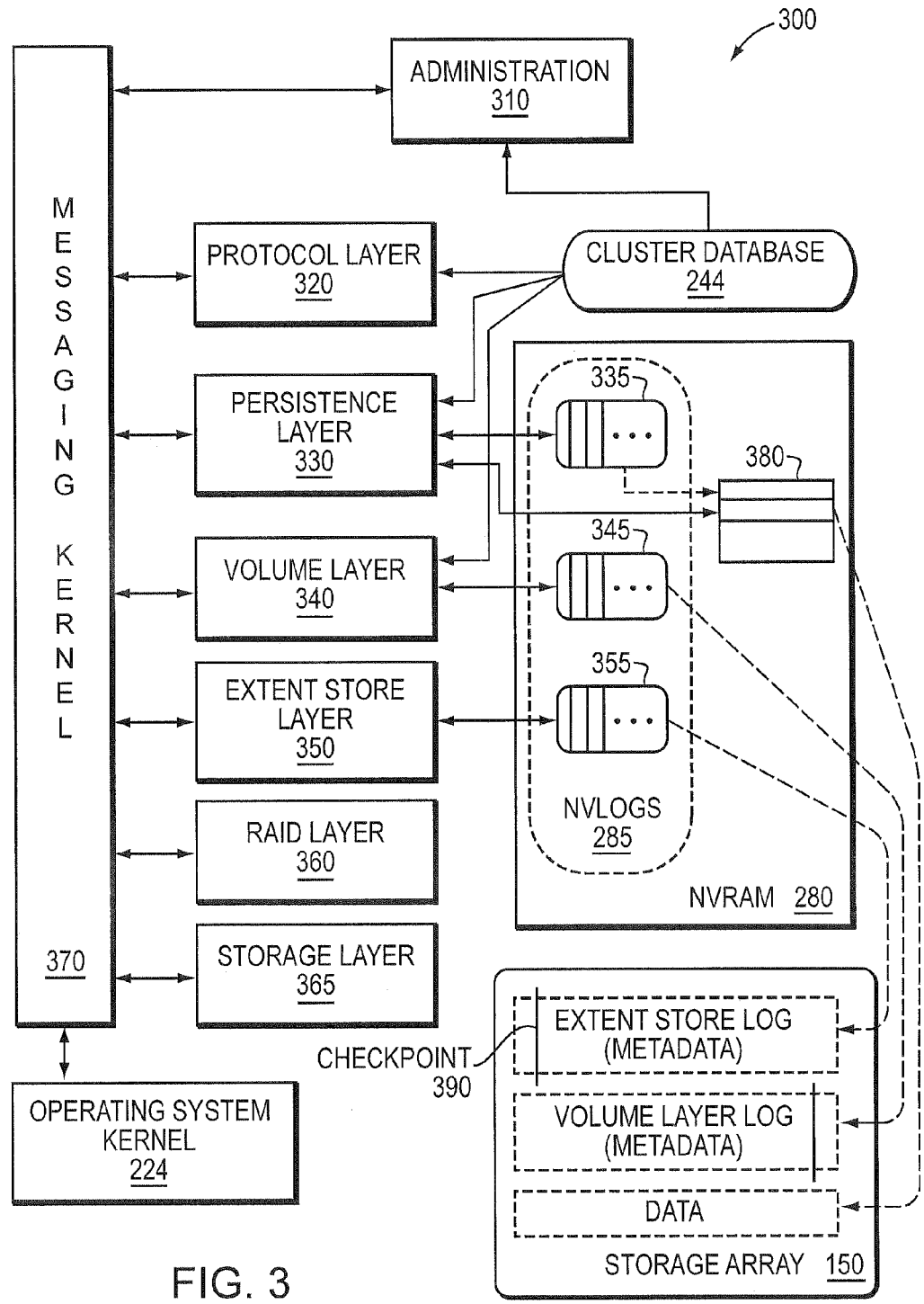
FIG. 3 is a block diagram of a storage input/output (I/O) stack of the node.

FIG. 3 is a block diagram of the storage I/O stack 300 that may be advantageously used with one or more embodiments described herein. The storage I/O stack 300 includes a plurality of software modules or layers that cooperate with other functional components of the nodes 200 to provide the distributed storage architecture of the cluster 100. In an embodiment, the distributed storage architecture presents an abstraction of a single storage container, i.e., all of the storage arrays 150 of the nodes 200 for the entire cluster 100 organized as one large pool of storage. In other words, the architecture consolidates storage, i.e., the SSDs 260 of the arrays 150, throughout the cluster (retrievable via cluster-wide keys) to enable storage of the LUNs. Both storage capacity and performance may then be subsequently scaled by adding nodes 200 to the cluster 100.

Illustratively, the storage I/O stack 300 includes an administration layer 310, a protocol layer 320, a persistence layer 330, a volume layer 340, an extent store layer 350, a Redundant Array of Independent Disks (RAID) layer 360, a storage layer 365 and a NVRAM (storing NVLogs) "layer" interconnected with a messaging kernel 370. The messaging kernel 370 may provide a message-based (or event-based) scheduling model (e.g., asynchronous scheduling) that employs messages as fundamental units of work exchanged (i.e., passed) among the layers. Suitable message-passing mechanisms provided by the messaging kernel to transfer information between the layers of the storage I/O stack 300 may include, e.g., for intra-node communication: i) messages that execute on a pool of threads, ii) messages that execute on a single thread progressing as an operation through the storage I/O stack, iii) messages using an Inter Process Communication (IPC) mechanism, and, e.g., for inter-node communication: messages using a Remote Procedure Call (RPC) mechanism in accordance with a function shipping implementation. Alternatively, the I/O stack may be implemented using a thread-based or stack-based execution model. In one or more embodiments, the messaging kernel 370 allocates processing resources from the operating system kernel 224 to execute the messages. Each storage I/O stack layer may be implemented as one or more instances (i.e., processes) executing one or more threads (e.g., in kernel or user space) that process the messages passed between the layers such that the messages provide synchronization for blocking and non-blocking operation of the layers.

In an embodiment, the protocol layer 320 may communicate with the host 120 over the network 130 by exchanging discrete frames or packets configured as I/O requests according to pre-defined protocols, such as iSCSI and FCP. An I/O request, e.g., a read or write request, may be directed to a LUN and may include I/O parameters such as, inter alia, a LUN identifier (ID), a logical block address (LBA) of the LUN, a length (i.e., amount of data) and, in the case of a write request, write data. The protocol layer 320 receives the I/O request and forwards it to the persistence layer 330, which records the request into a persistent write-back cache 380 illustratively embodied as a log whose contents can be replaced randomly, e.g., under some random access replacement policy rather than only in serial fashion, and returns an acknowledgement to the host 120 via the protocol layer 320. In an embodiment only I/O requests that modify the LUN, e.g., write requests, are logged. Notably, the I/O request may be logged at the node receiving the I/O request, or in an alternative embodiment in accordance with the function shipping implementation, the I/O request may be logged at another node.

Illustratively, dedicated logs may be maintained by the various layers of the storage I/O stack 300. For example, a dedicated log 335 may be maintained by the persistence layer 330 to record the I/O parameters of an I/O request as equivalent internal, i.e., storage I/O stack, parameters, e.g., volume ID, offset, and length. In the case of a write request, the persistence layer 330 may also cooperate with the NVRAM 280 to implement the write-back cache 380 configured to store the write data associated with the write request. In an embodiment, the write-back cache may be structured as a log. Notably, the write data for the write request may be physically stored in the cache 380 such that the log 335 contains the reference to the associated write data. It will be understood to persons skilled in the art that other variations of data structures may be used to store or maintain the write data in NVRAM including data structures with no logs. In an embodiment, a copy of the write-back cache may be also maintained in the memory 220 to facilitate direct memory access to the storage controllers. In other embodiments, caching may be performed at the host 120 or at a receiving node in accordance with a protocol that maintains coherency between the data stored at the cache and the cluster.

In an embodiment, the administration layer 310 may apportion the LUN into multiple volumes, each of which may be partitioned into multiple regions (e.g., allotted as disjoint block address ranges), with each region having one or more segments stored as multiple stripes on the array 150. A plurality of volumes distributed among the nodes 200 may thus service a single LUN, i.e., each volume within the LUN services a different LBA range (i.e., offset range) or set of ranges within the LUN. Accordingly, the protocol layer 320 may implement a volume mapping technique to identify a volume to which the I/O request is directed (i.e., the volume servicing the offset range indicated by the parameters of the I/O request). Illustratively, the cluster database 244 may be configured to maintain one or more associations (e.g., key-value pairs) for each of the multiple volumes, e.g., an association between the LUN ID and a volume, as well as an association between the volume and a node ID for a node managing the volume. The administration layer 310 may also cooperate with the database 244 to create (or delete) one or more volumes associated with the LUN (e.g., creating a volume ID/LUN key-value pair in the database 244). Using the LUN ID and LBA (or LBA range), the volume mapping technique may provide a volume ID (e.g., using appropriate associations in the cluster database 244) that identifies the volume and node servicing the volume destined for the request as well as translate the LBA (or LBA range) into an offset and length within the volume. Specifically, the volume ID is used to determine a volume layer instance that manages volume metadata associated with the LBA or LBA range. As noted, the protocol layer 320 may pass the I/O request (i.e., volume ID, offset and length) to the persistence layer 330, which may use the function shipping (e.g., inter-node) implementation to forward the I/O request to the appropriate volume layer instance executing on a node in the cluster based on the volume ID.

In an embodiment, the volume layer 340 may manage the volume metadata by, e.g., maintaining states of host-visible containers, such as ranges of LUNs, and performing data management functions, such as creation of snapshots and clones, for the LUNs in cooperation with the administration layer 310. The volume metadata is illustratively embodied as in-core mappings from LUN addresses (i.e., offsets) to durable extent keys, which are unique cluster-wide IDs associated with SSD storage locations for extents within an extent key space of the cluster-wide storage container. That is, an extent key may be used to retrieve the data of the extent at an SSD storage location associated with the extent key. Alternatively, there may be multiple storage containers in the cluster wherein each container has its own extent key space, e.g., where the administration layer 310 provides distribution of extents among the storage containers. An extent is a variable length block of data that provides a unit of storage on the SSDs and that need not be aligned on any specific boundary, i.e., it may be byte aligned. Accordingly, an extent may be an aggregation of write data from a plurality of write requests to maintain such alignment. Illustratively, the volume layer 340 may record the forwarded request (e.g., information or parameters characterizing the request), as well as changes to the volume metadata, in dedicated log 345 maintained by the volume layer 340. Subsequently, the contents of the volume layer log 345 may be written to the storage array 150 in accordance with a checkpoint (e.g., synchronization) operation that stores in-core metadata on the array 150. That is, the checkpoint operation (checkpoint) ensures that a consistent state of metadata, as processed in-core, is committed to (i.e., stored on) the storage array 150; whereas retirement of log entries ensures that the entries accumulated in the volume layer log 345 synchronize with the metadata checkpoints committed to the storage array 150 by, e.g., retiring those accumulated log entries prior to the checkpoint. In one or more embodiments, the checkpoint and retirement of log entries may be data driven, periodic or both.

In an embodiment, the extent store layer 350 is responsible for storing extents on the SSDs 260 (i.e., on the storage array 150) and for providing the extent keys to the volume layer 340 (e.g., in response to a forwarded write request). The extent store layer 350 is also responsible for retrieving data (e.g., an existing extent) using an extent key (e.g., in response to a forwarded read request). The extent store layer 350 may be responsible for performing de-duplication and compression on the extents prior to storage. The extent store layer 350 may maintain in-core mappings (e.g., embodied as hash tables) of extent keys to SSD storage locations (e.g., offset on an SSD 260 of array 150). The extent store layer 350 may also maintain a dedicated log 355 of entries that accumulate requested "put" and "delete" operations (i.e., write requests and delete requests for extents issued from other layers to the extent store layer 350), where these operations change the in-core mappings (i.e., hash table entries). Subsequently, the in-core mappings and contents of the extent store layer log 355 may be written to the storage array 150 in accordance with a "fuzzy" checkpoint 390 (i.e., checkpoint with incremental changes recorded in one or more log files) in which selected in-core mappings (less than the total) are committed to the array 150 at various intervals (e.g., driven by an amount of change to the in-core mappings, size thresholds of log 355, or periodically). Notably, the accumulated entries in log 355 may be retired once all in-core mappings have been committed to include the changes recorded in those entries.

In an embodiment, the RAID layer 360 may organize the SSDs 260 within the storage array 150 as one or more RAID groups (e.g., sets of SSDs) that enhance the reliability and integrity of extent storage on the array by writing data "stripes" having redundant information, i.e., appropriate parity information with respect to the striped data, across a given number of SSDs 260 of each RAID group. The RAID layer 360 may also store a number of stripes (e.g., stripes of sufficient depth), e.g., in accordance with a plurality of contiguous range write operations, so as to reduce data relocation (i.e., internal flash block management) that may occur within the SSDs as a result of the operations. In an embodiment, the storage layer 365 implements storage I/O drivers that may communicate directly with hardware (e.g., the storage controllers and cluster interface) cooperating with the operating system kernel 224, such as a Linux virtual function I/O (VFIO) driver.

Write Path

Figure 4:
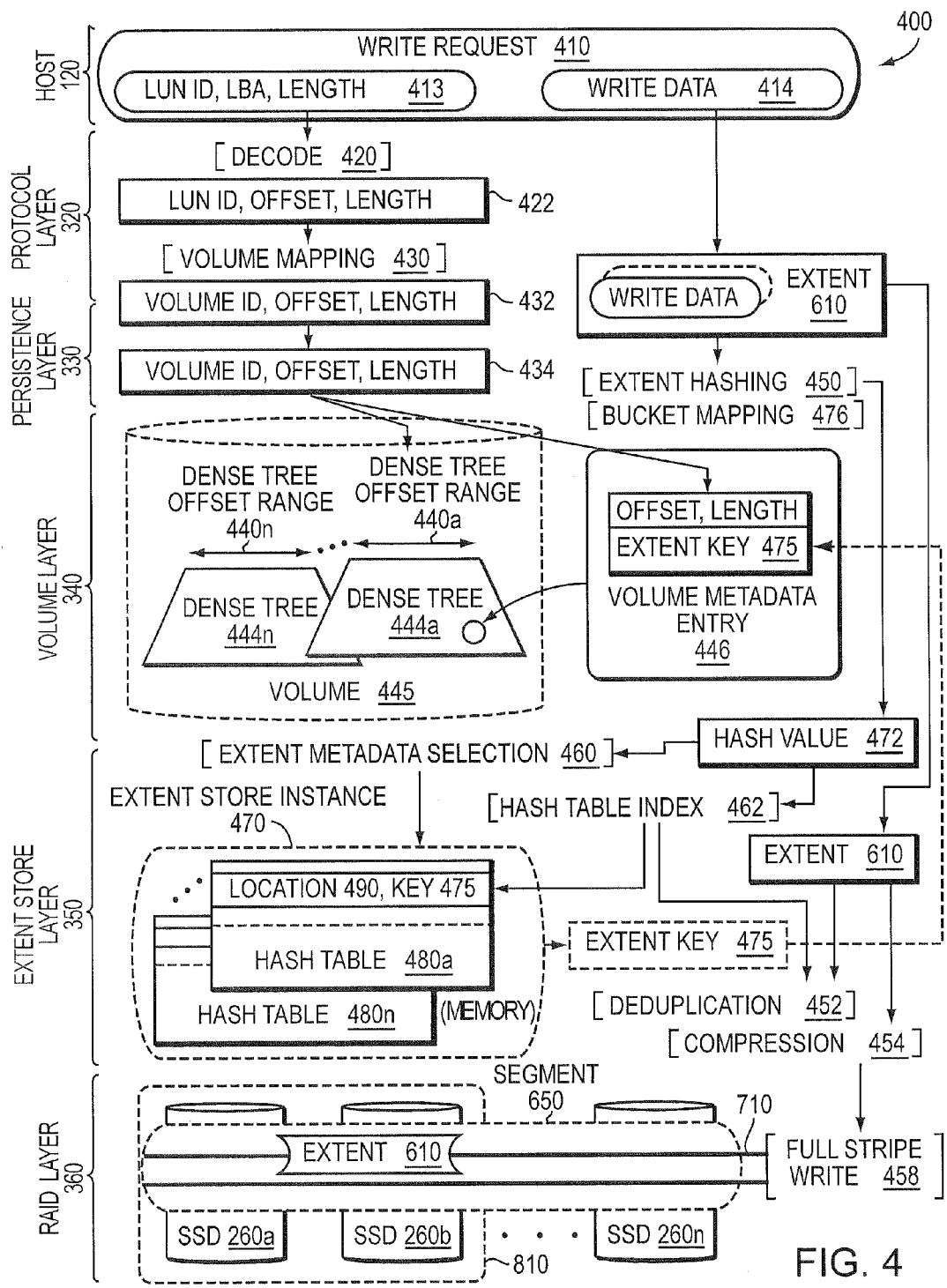
FIG. 4 illustrates a write path of the storage I/O stack.

FIG. 4 illustrates an I/O (e.g., write) path 400 of the storage I/O stack 300 for processing an I/O request, e.g., a SCSI write request 410. The write request 410 may be issued by host 120 and directed to a LUN stored on the storage arrays 150 of the cluster 100. Illustratively, the protocol layer 320 receives and processes the write request by decoding 420 (e.g., parsing and extracting) fields of the request, e.g., LUN ID, LBA and length (shown at 413), as well as write data 414. The protocol layer 320 may also implement a volume mapping technique 430 (described above) that translates the LUN ID and LBA range (i.e., equivalent offset and length) of the write request to an appropriate volume layer instance, i.e., volume ID (volume 445), in the cluster 100 that is responsible for managing volume metadata for the LBA range. In an alternative embodiment, the persistence layer 330 may implement the above described volume mapping technique 430. The protocol layer then passes the results 432, e.g., volume ID, offset, length (as well as write data), to the persistence layer 330, which records the request in the persistence layer log 335 and returns an acknowledgement to the host 120 via the protocol layer 320. The persistence layer 330 may aggregate and organize write data 414 from one or more write requests into a new extent 610 and perform a hash computation, i.e., a hash function, on the new extent to generate a hash value 472 in accordance with an extent hashing technique 450.

The persistence layer 330 may then pass the write request with aggregated write data including, e.g., the volume ID, offset and length, as parameters 434 to the appropriate volume layer instance. In an embodiment, message passing of the parameters 434 (received by the persistence layer) may be redirected to another node via the function shipping mechanism, e.g., RPC, for inter-node communication. Alternatively, message passing of the parameters 434 may be via the IPC mechanism, e.g., message threads, for intra-node communication.

In one or more embodiments, a bucket mapping technique 476 is provided that translates the hash value 472 to an instance 470 of an appropriate extent store layer (i.e., extent store instance 470) that is responsible for storing the new extent 610. Note, the bucket mapping technique may be implemented in any layer of the storage I/O stack above the extent store layer. In an embodiment, for example, the bucket mapping technique may be implemented in the persistence layer 330, the volume layer 340, or a layer that manages cluster-wide information, such as a cluster layer (not shown). Accordingly, the persistence layer 330, the volume layer 340, or the cluster layer may contain computer executable instructions executed by the CPU 210 to perform operations that implement the bucket mapping technique 476 described herein. The persistence layer 330 may then pass the hash value 472 and the new extent 610 to the appropriate volume layer instance and onto the appropriate extent store instance via an extent store put operation. The extent hashing technique 450 may embody an approximately uniform hash function to ensure that any random extent to be written may have an approximately equal chance of falling into any extent store instance 470, i.e., hash buckets are distributed across extent store instances of the cluster 100 based on available resources. As a result, the bucket mapping technique 476 provides load-balancing of write operations (and, by symmetry, read operations) across nodes 200 of the cluster, while also leveling flash wear in the SSDs 260 of the cluster.

In response to the put operation, the extent store instance may process the hash value 472 to perform an extent metadata selection technique 460 that (i) selects an appropriate hash table 480 (e.g., hash table 480a) from a set of hash tables (illustratively in-core) within the extent store instance 470, and (ii) extracts a hash table index 462 from the hash value 472 to index into the selected hash table and lookup a table entry having an extent key 475 identifying a storage location 490 on SSD 260 for the extent. Accordingly, the extent store layer 350 contains computer executable instructions executed by the CPU 210 to perform operations that implement the extent metadata selection technique 460 described herein. If a table entry with a matching extent key is found, then the SSD location 490 mapped from the extent key 475 is used to retrieve an existing extent (not shown) from SSD. The existing extent is then compared with the new extent 610 to determine whether their data is identical. If the data is identical, the new extent 610 is already stored on SSD 260 and a de-duplication opportunity (denoted de-duplication 452) exists such that there is no need to write another copy of the data. Accordingly, a reference count in the table entry for the existing extent is incremented and the extent key 475 of the existing extent is passed to the appropriate volume layer instance for storage within an entry (denoted as volume metadata entry 446) of a dense metadata structure 444 (e.g., dense tree 444a), such that the extent key 475 is associated an offset range 440 (e.g., offset range 440a) of the volume 445.

However, if the data of the existing extent is not identical to the data of the new extent 610, a collision occurs and a deterministic algorithm is invoked to sequentially generate as many new candidate extent keys (not shown) mapping to the same bucket as needed to either provide de-duplication 452 or to produce an extent key that is not already stored within the extent store instance. Notably, another hash table (e.g. hash table 480n) of extent store instance 470 may be selected by a new candidate extent key in accordance with the extent metadata selection technique 460. In the event that no de-duplication opportunity exists (i.e., the extent is not already stored) the new extent 610 is compressed in accordance with compression technique 454 and passed to the RAID layer 360, which processes the new extent 610 for storage on SSD 260 within one or more stripes 710 of RAID group 810. The extent store instance may cooperate with the RAID layer 360 to identify a storage segment 650 (i.e., a portion of the storage array 150) and a location on SSD 260 within the segment 650 in which to store the new extent 610. Illustratively, the identified storage segment is a segment with a large contiguous free space having, e.g., location 490 on SSD 260b for storing the extent 610.

In an embodiment, the RAID layer 360 then writes the stripes 710 across the RAID group 810, illustratively as one or more full stripe writes 458. The RAID layer 360 may write a series of stripes 710 of sufficient depth to reduce data relocation that may occur within flash-based SSDs 260 (i.e., flash block management). The extent store instance then (i) loads the SSD location 490 of the new extent 610 into the selected hash table 480n (i.e., as selected by the new candidate extent key), (ii) passes a new extent key (denoted as extent key 475) to the appropriate volume layer instance for storage within an entry (also denoted as volume metadata entry 446) of a dense tree 444 managed by that volume layer instance, and (iii) records a change to extent metadata of the selected hash table in the extent store layer log 355. Illustratively, the volume layer instance selects dense tree 444a spanning an offset range 440a of the volume 445 that encompasses the offset range of the write request. As noted, the volume 445 (e.g., an offset space of the volume) is partitioned into multiple regions (e.g., allotted as disjoint offset ranges); in an embodiment, each region is represented by a dense tree 444. The volume layer instance then inserts the volume metadata entry 446 into the dense tree 444a and records a change corresponding to the volume metadata entry in the volume layer log 345. Accordingly, the I/O (write) request is sufficiently stored on SSD 260 of the cluster.

Read Path

Figure 5:
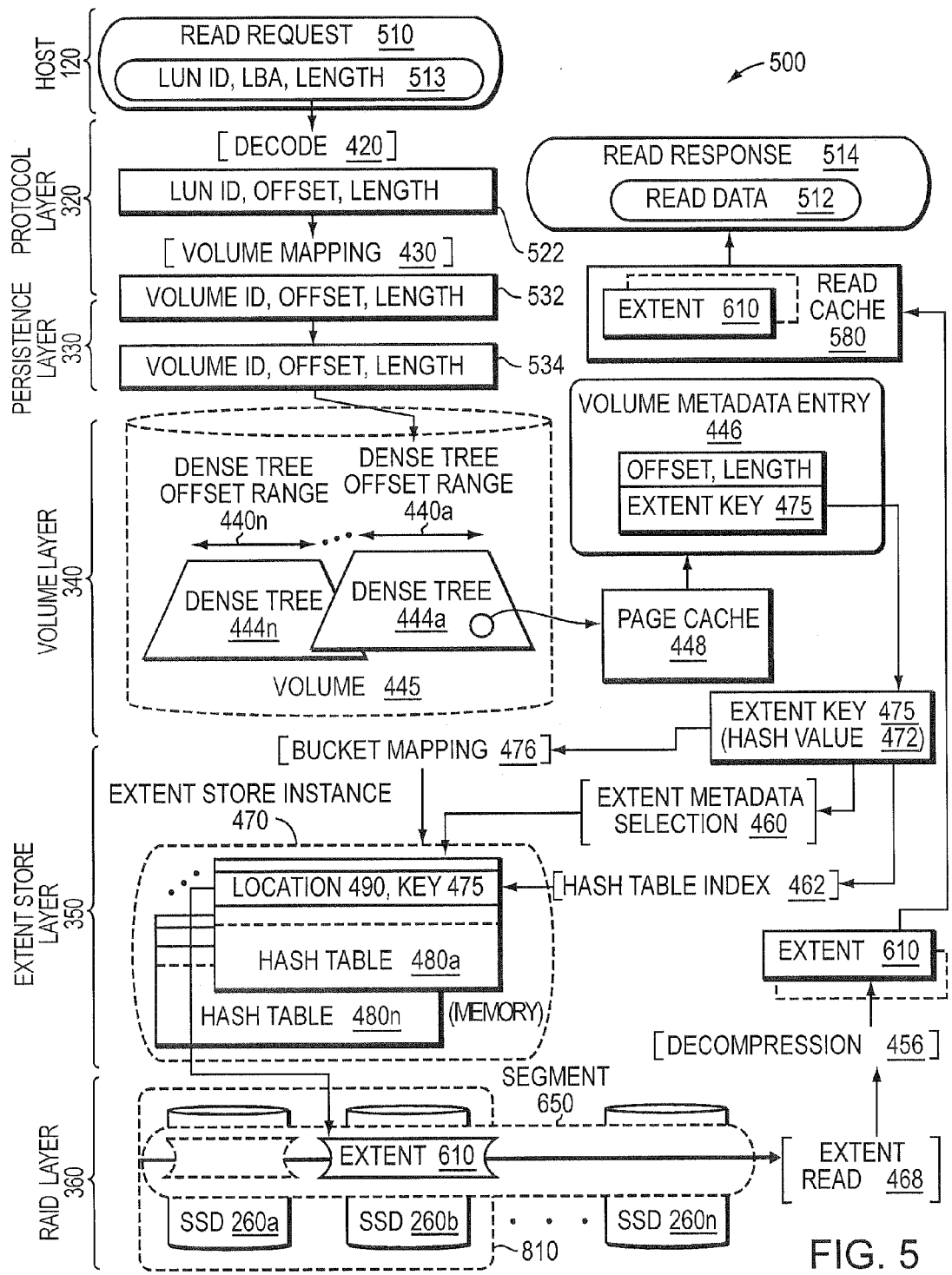
FIG. 5 illustrates a read path of the storage I/O stack.

FIG. 5 illustrates an I/O (e.g., read) path 500 of the storage I/O stack 300 for processing an I/O request, e.g., a SCSI read request 510. The read request 510 may be issued by host 120 and received at the protocol layer 320 of a node 200 in the cluster 100. Illustratively, the protocol layer 320 processes the read request by decoding 420 (e.g., parsing and extracting) fields of the request, e.g., LUN ID, LBA, and length (shown at 513), and uses the decoded results 522, e.g., LUN ID, offset, and length, for the volume mapping technique 430. That is, the protocol layer 320 may implement the volume mapping technique 430 (described above) to translate the LUN ID and LBA range (i.e., equivalent offset and length) of the read request to an appropriate volume layer instance, i.e., volume ID (volume 445), in the cluster 100 that is responsible for managing volume metadata for the LBA (i.e., offset) range. The protocol layer then passes the results 532 to the persistence layer 330, which may search the write-back cache 380 to determine whether some or all of the read request can be serviced from its cached data. If the entire request cannot be serviced from the cached data, the persistence layer 330 may then pass the remaining portion of the request including, e.g., the volume ID, offset and length, as parameters 534 to the appropriate volume layer instance in accordance with the function shipping mechanism (e.g., RPC, for inter-node communication) or the IPC mechanism (e.g., message threads, for intra-node communication).

The volume layer instance may process the read request to access a dense tree metadata structure 444 (e.g., dense tree 444a) associated with a region (e.g., offset range 440a) of a volume 445 that encompasses the requested offset range (specified by parameters 534). The volume layer instance may further process the read request to search for (lookup) one or more volume metadata entries 446 of the dense tree 444a to obtain one or more extent keys 475 associated with one or more extents 610 (or portions of extents) within the requested offset range. In an embodiment, each dense tree 444 may be embodied as multiple levels of a search structure with possibly overlapping offset range entries at each level. The various levels of the dense tree may have volume metadata entries 446 for the same offset, in which case, the higher level has the newer entry and is used to service the read request. A top level of the dense tree 444 is illustratively resident in-core and a page cache 448 may be used to access lower levels of the tree. If the requested range or portion thereof is not present in the top level, a metadata page associated with an index entry at the next lower tree level (not shown) is accessed. The metadata page (i.e., in the page cache 448) at the next level is then searched to find any overlapping entries. This process is then iterated until a volume metadata entry 446 of a level is found to ensure that the extent key(s) 475 for the entire requested read range are found.

Once found, each extent key 475 is processed by the volume layer 340 to, e.g., implement the bucket mapping technique 476 that translates the extent key to an appropriate extent store instance 470 responsible for storing the requested extent 610. Note that, in an embodiment, each extent key 475 may be substantially identical to the hash value 472 associated with the extent 610, i.e., the hash value as calculated during the write request for the extent, such that the bucket mapping 476 and extent metadata selection 460 techniques may be used for both write and read path operations. Note also that the extent key 475 may be derived from the hash value 472. The volume layer 340 may then pass the extent key 475 (i.e., the hash value from a previous write request for the extent) to the appropriate extent store instance 470 (via an extent store get operation), which performs an extent key-to-SSD mapping to determine the location on SSD 260 for the extent.

In response to the get operation, the extent store instance may process the extent key 475 (i.e., hash value 472) to perform the extent metadata selection technique 460 that (i) selects an appropriate hash table 480 (e.g., hash table 480a) from a set of hash tables within the extent store instance 470, and (ii) extracts a hash table index 462 from the extent key 475 (i.e., hash value 472) to index into the selected hash table and lookup a table entry having a matching extent key 475 that identifies a storage location 490 on SSD 260 for the extent 610. That is, the SSD location 490 mapped to the extent key 475 may be used to retrieve the existing extent (denoted as extent 610) from SSD 260 (e.g., SSD 260b). The extent store instance then cooperates with the RAID layer 360 to access the extent on SSD 260b and retrieve the data contents in accordance with the read request. Illustratively, the RAID layer 360 may read the extent in accordance with an extent read operation 468 and pass the extent 610 to the extent store instance. The extent store instance may then decompress the extent 610 in accordance with a decompression technique 456, although it will be understood to those skilled in the art that decompression can be performed at any layer of the storage I/O stack 300. The extent 610 may be stored in a buffer (not shown) in memory 220 and a reference to that buffer may be passed back through the layers of the storage I/O stack. The persistence layer may then load the extent into a read cache 580 (or other staging mechanism) and may extract appropriate read data 512 from the read cache 580 for the LBA range of the read request 510. Thereafter, the protocol layer 320 may create a SCSI read response 514, including the read data 512, and return the read response to the host 120.

Layered File System

The embodiments described herein illustratively employ a layered file system of the storage I/O stack. The layered file system includes a flash-optimized, log-structured layer (i.e., extent store layer) of the file system configured to provide sequential storage of data and metadata (i.e., log-structured layout) on the SSDs 260 of the cluster. The data may be organized as an arbitrary number of variable-length extents of one or more host-visible LUNs served by the nodes. The metadata may include mappings from host-visible logical block address ranges (i.e., offset ranges) of a LUN to extent keys, as well as mappings of the extent keys to SSD storage locations of the extents. Illustratively, the volume layer of the layered file system cooperates with the extent store layer to provide a level of indirection that facilitates efficient log-structured layout of extents on the SSDs by the extent store layer.

In an embodiment, functions of the log-structured layer of the file system, such as write allocation and flash device (i.e., SSD) management, are performed and maintained by the extent store layer 350. Write allocation may include gathering of the variable-length extents to form full stripes that may be written to free segments across SSDs of one or more RAID groups, whereas flash device management may include segment cleaning to create such free segments that indirectly map to the SSDs. Instead of relying on garbage collection in the SSDs, the storage I/O stack may implement segment cleaning (i.e., garbage collection) in the extent store layer to bypass performance impacts of flash translation layer (FTL) functionality (including garbage collection) in the SSD. In other words, the storage I/O stack allows the log-structured layer of the file system to operate as a data layout engine using segment cleaning to effectively replace the FTL functionality of the SSD. The extent store layer may thus process random write requests in accordance with segment cleaning (i.e., garbage collection) to predict flash behavior within its FTL functionality. As a result, a log-structured equivalent source of write amplification for the storage I/O stack may be consolidated and managed at the extent store layer. In addition, the log-structured layer of the file system may be employed, in part, to improve write performance from the flash devices of the storage array.

Segment Cleaning

Figure 6:
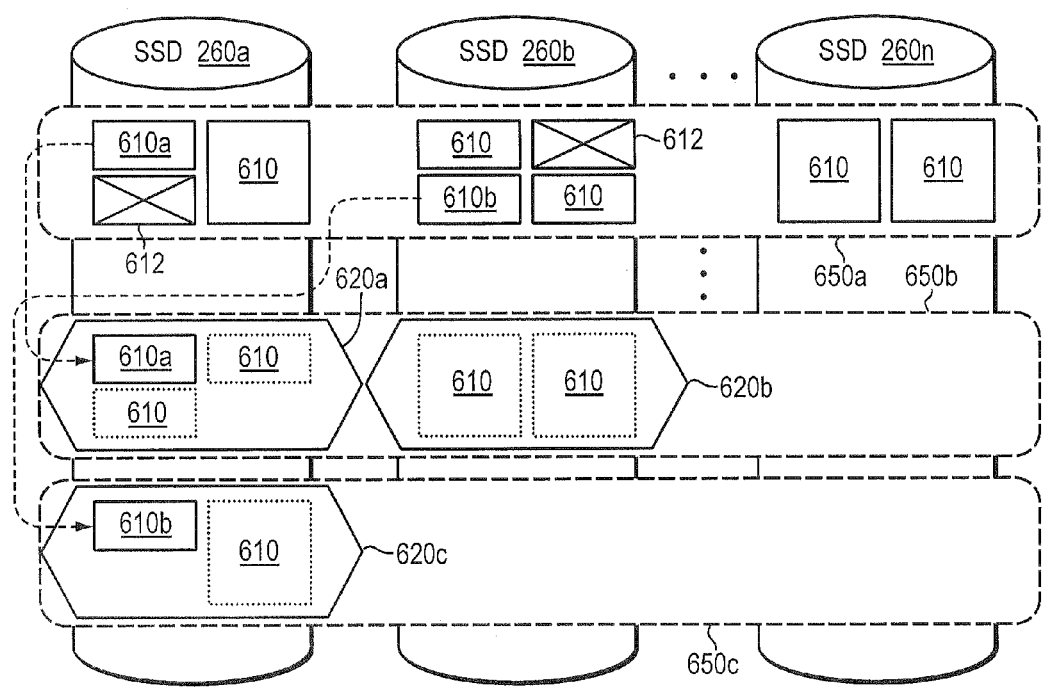
FIG. 6 illustrates segment cleaning by a layered file system.

FIG. 6 illustrates segment cleaning by the layered file system. In an embodiment, the extent store layer 350 of the layered file system may write extents to an empty or free region or "segment." Before rewriting that segment again, the extent store layer 350 may clean the segment in accordance with segment cleaning which, illustratively, may be embodied as a segment cleaning process. The segment cleaning process may read all valid extents 610 from an old segment 650a and write those valid extents (i.e., extents not deleted or overwritten 612) to one or more new segments 650b-c, to thereby free-up (i.e., "clean") the old segment 650a. New extents may then be written sequentially to the old (now clean) segment. The layered file system may maintain a certain amount of reserve space (i.e., free segments) to enable efficient performance of segment cleaning. For example, the layered file system may illustratively maintain a reserve space of free segments equivalent to approximately 7% of storage capacity. The sequential writing of new extents may manifest as full stripe writes 458, such that a single write operation to storage spans all SSDs in a RAID group 810. Write data may be accumulated until a stripe write operation of a minimum depth can be made.

Illustratively, segment cleaning may be performed to free one or more selected segments that indirectly map to SSDs. As used herein, a SSD may be composed of a plurality of segment chunks 620, wherein each chunk is illustratively approximately 1 GB in size. A segment may include a segment chunk 620a-c from each of a plurality of SSDs in a RAID group 810. Thus, for a RAID group having 24 SSDs, wherein 22 SSDs store data (data SSDs) and 2 SSDs store parity (parity SSDs), each segment may include 22 GB of data and 2 GB of parity. The RAID layer may further configure the RAID groups according to one or more RAID implementations, e.g., RAID 1, 4, 5 and/or 6, to thereby provide protection over the SSDs in the event of, e.g., failure to one or more SSDs. Notably, each segment may be associated with a different RAID group and, thus, may have a different RAID configuration, i.e., each RAID group may be configured according to a different RAID implementation. To free-up or clean selected segments, extents of the segments that contain valid data are moved to different clean segments and the selected segments (now clean) are freed for subsequent reuse. Segment cleaning consolidates fragmented free space to improve write efficiency, e.g., to underlying flash blocks by reducing performance impacts of the FTL. Once a segment is cleaned and designated freed, data may be written sequentially to that segment. Accounting structures, e.g., free segment maps or an amount of segment free space, maintained by the extent store layer for write allocation, may be employed by the segment cleaning process. Notably, selection of a clean segment to receive data (i.e., writes) from a segment being cleaned may be based upon the amount of free space remaining in the clean segment and/or the last time the clean segment was used. Note further that different portions of data from the segment being cleaned may be moved to different "target" segments. That is, a plurality of relatively clean segments 650*b*,*c* may receive differing portions of data from the segment 650*a* being cleaned.

Illustratively, segment cleaning may cause some write amplification in the storage array (SSDs). However, the file system may reduce such write amplification by writing extents to the SSDs sequentially as a log device. For example, given SSDs with an erase block size of approximately 2 MBs, by writing at least 2 MB of data (extents) sequentially to a free segment, an entire erase block may be overwritten and fragmentation at the SSD level may be eliminated (i.e., reducing garbage collection in the SSD). Yet, the SSDs typically stripe data across multiple flash components and across multiple channels (i.e., storage controllers 240) in order to realize performance. Thus, a relatively large (e.g., 1 GB) write granularity to a free (i.e., clean) segment may be necessary to avoid write amplification at the SSD level (i.e., to override internal SSD striping).

In an embodiment, because the erase block boundaries in the SSD may be unknown, the write granularity should be large enough so that a sequence of writes for extents over a large contiguous range may overwrite previously written extents on the SSD and effectively override garbage collection in the SSDs. In other words, such garbage collection may be preempted because the new data is written over the same range as previous data such that the new data completely overwrites the previously written data. This approach also avoids consuming the reserve space capacity with the new write data. Accordingly, an advantage of the log-structured feature of the storage I/O stack (i.e., log-structured layer of the file system) is the ability to reduce write amplification of the SSDs with only a minimum amount of reserve space in the SSDs. This log-structured feature effectively "moves" flash device management of reserve space from the SSD to the extent store layer, which uses that reserve space to manage the write amplification. Thus, instead of having two sources of write amplification (i.e., the extent store layer and the SSD FTL, which multiply) there is only one source of write amplification (i.e., the extent store layer).

Write Allocation

In an embodiment, there may be multiple RAID stripes per segment. Each time a segment is allocated, i.e., after cleaning the segment, the chunks of various SSDs within the segment may include a series of RAID stripes, each aligned by extent. The chunks may be at the same or different offsets within the SSDs. The extent store layer may read the chunks sequentially for cleaning purposes and relocate all the valid data to another segment. Thereafter, the chunks 620 of the cleaned segment may be freed and a decision may be rendered as to how to constitute the next segment that uses the chunks. For example, if a SSD is removed from a RAID group, a portion (i.e., a set of chunks 620) of capacity may be omitted from the next segment (i.e., change in RAID stripe configuration) so as to constitute the RAID group from a plurality of chunks 620 that is one chunk narrower, i.e., making the RAID width one less. Thus, by using segment cleaning, a RAID group of the chunks 620 constituting the segments may be effectively created each time a new segment is allocated, i.e., a RAID group is created dynamically from available SSDs when a new segment is allocated. There is generally no requirement to include all of the SSDs 260 in the storage array 150 in the new segment. Alternatively, a chunk 620 from a newly introduced SSD can be added into a RAID group created when a new segment 650 is allocated.

Figure 7:
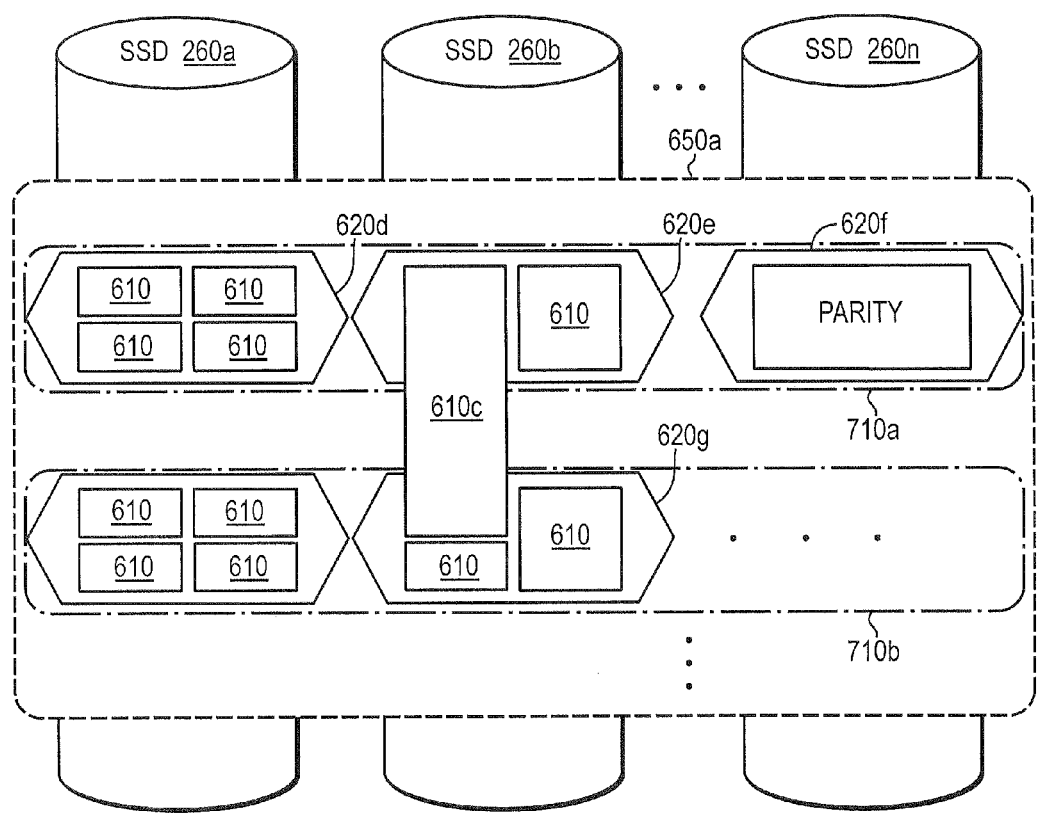
FIG. 7 illustrates a RAID stripe formed by the layered file system.

FIG. 7 illustrates a RAID stripe formed by the layered file system. As noted, write allocation may include gathering of the variable-length extents to form one or more stripes across SSDs of one or more RAID groups. In an embodiment, the RAID layer 360 may manage parity computations and topology information used for placement of the extents 610 on the SSDs 260*a*-*n* of the RAID group 810. To that end, the RAID layer may cooperate with the extent store layer to organize the extents as stripes 710 within the RAID group. Illustratively, the extent store layer may gather the extents 610 to form one or more full stripes 710 that may be written to a free segment 650*a* such that a single stripe write operation 458 may span all SSDs in that RAID group. The extent store layer may also cooperate with the RAID layer to pack each stripe 710 as a full stripe of variable-length extents 610. Once the stripe is complete, the RAID layer may pass the full stripe 710 of extents as a set of chunks 620*d*-*f* to the storage layer 365 of the storage I/O stack for storage on the SSDs 260. By writing a full stripe (i.e., data and parity) to the free segment, the layered file system avoids the cost of parity updates and spreads any required read operation load across the SSDs.

In an embodiment, an extent store may be viewed as a global pool of extents stored on the storage arrays 150 of the cluster, where each extent may be maintained within a RAID group 810 of an extent store instance. Assume one or more variable-length (i.e., small and/or large) extents are written to a segment. The extent store layer may gather the variable-length extents to form one or more stripes across the SSDs of the RAID group. Although each stripe may include multiple extents 610 and an extent 610*c* could span more than one stripe 710*a*,*b*, each extent is entirely stored on one SSD. In an embodiment, a stripe may have a depth of 16 KB and an extent may have a size of 4 KB, but the extent may thereafter be compressed down to 1 or 2 KB or smaller permitting a larger extent to be packed which may exceed the stripe depth (i.e., the chunk 620*g* depth). Thus, a stripe may constitute only part of the extent, so the depth of the stripe 710 (i.e., the set of chunks 620d-f constituting the stripe) may be independent of the extent(s) written to any one SSD. Since the extent store layer may write the extents as full stripes across one or more free segments of the SSDs, write amplification associated with processing information of the stripes may be reduced.

Operationally, the extent store layer may send the extents to the RAID layer, which attempts to pack the stripes as much as possible with the compressed, variable length extents. In an embodiment, a minimum unit of write operation in the storage I/O stack may constitute a stripe depth of 4 KB, or 8 sectors of 512 or 520 bytes depending on the underlying sector size of the SSD. Once a full stripe is complete, the RAID layer may pass the extents to the storage layer, which may cooperate with the persistence layer to store the full stripe of extents on the SSDs. Notably, the size of write operations may vary depending on the write load on the system. Write operations may vary from a minimum of about 4 KB chunks per SSD under a light write load, to a maximum of 64 KB chunks per SSD under a heavy write load, which may be determined by pressure in the persistent write-back cache 380. As such, the persistence layer may wait until enough write data is accumulated in the write-back cache (i.e., a larger write size) before writing data (i.e., larger chunk sizes) to SSD. Alternatively, a smaller write size may be chosen to ensure timely and safe storage of the data on SSD (i.e., smaller chunks written more frequently to SSD). Accordingly, the layered file system may control write operations (i.e., chunks to SSD) both in frequency and size to sustain an effective streaming bandwidth to the SSDs of the storage array, thereby efficiently using the SSDs while overriding their garbage collection. As noted, a sufficient amount of write data over a contiguous range within a time frame (i.e., temporal locality) may be required to effectively override garbage collection in the SSDs.

File System Driven RAID Rebuild

The embodiments described herein are directed to a file system driven RAID rebuild technique. The layered file system may organize storage of data as segments spanning one or more sets of storage devices, such as SSDs, of the storage array, wherein each set of SSDs may form a RAID group configured to provide data redundancy for a segment. The file system may then drive (i.e., initiate) rebuild of a RAID configuration of the SSDs on a segment-by-segment basis in response to cleaning of the segment (i.e., segment cleaning). That is, rebuild of the RAID configuration occurs in response to the file system operation of segment cleaning, rather than as an independent operation. Each segment may include one or more RAID stripes that provide a level of data redundancy (e.g., single parity RAID 5 or double parity RAID 6) as well as RAID organization (i.e., distribution of data and parity) for the segment. Notably, the level of data redundancy and RAID organization may differ among the segments of the array. Illustratively, the distribution of parity may occur by choosing different parity locations (i.e., SSDs) for different segments, rather than by distributing parity within each segment. That is, although fixed parity SSDs may be chosen for each segment (i.e., the same one or more SSDs may be used for parity and/or diagonal parity for the entire segment) different parity SSDs may be chosen for other segments. Accordingly, parity distribution (e.g., RAID 5, RAID 6) may thus be realized, but on a segment-by-segment basis with a fixed parity arrangement within each segment. Advantageously, the file system RAID rebuild technique permits expanding capacity (i.e., adding storage capacity) to any segment without having to redistribute the parity information within that segment because the expanded capacity may use the same fixed parity. The additional capacity may then be available for immediate use (i.e., chunks may be written to the segment without first redistributing parity within the segment).

Figure 8:
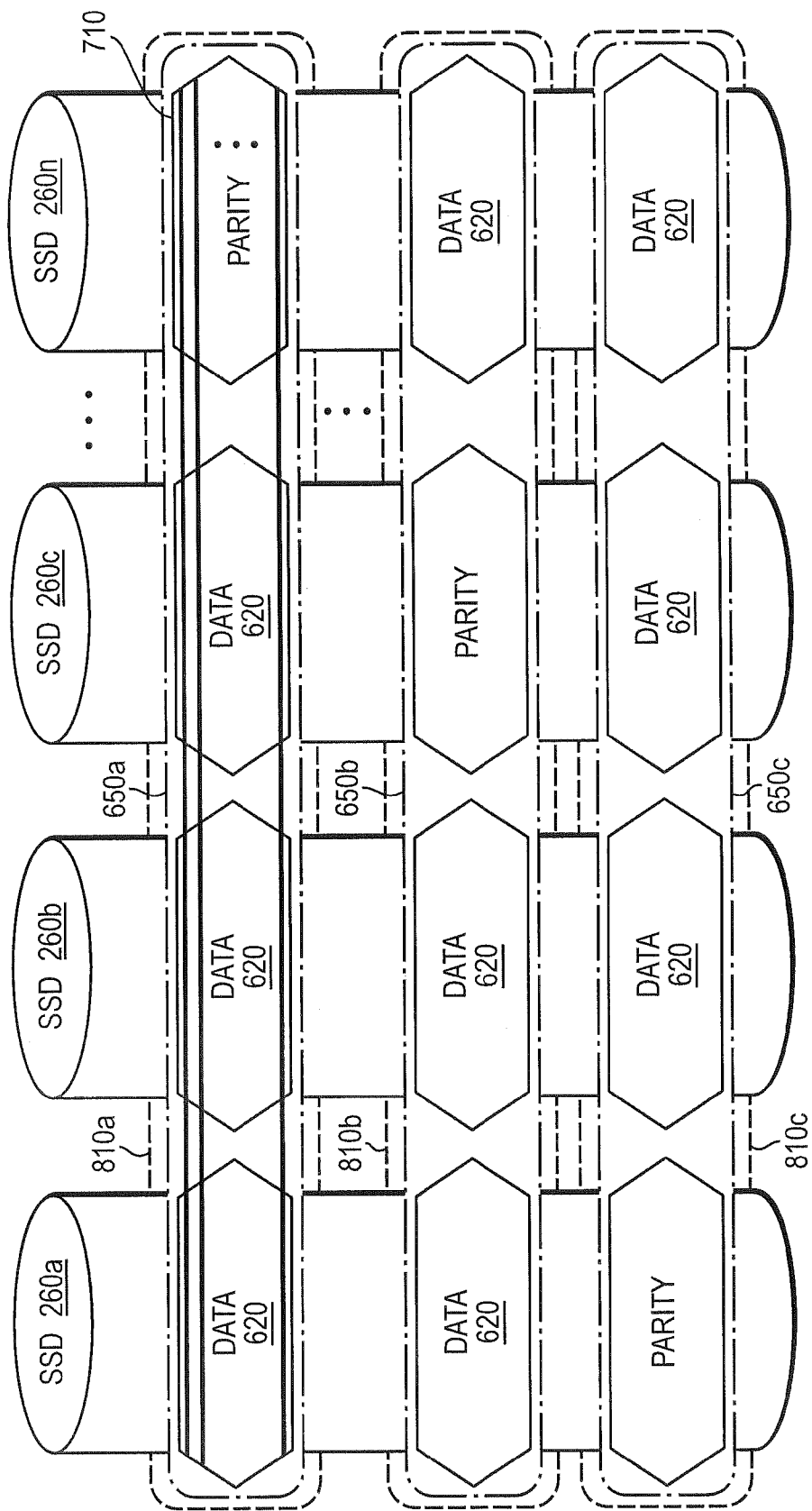
FIG. 8 illustrates a file system driven RAID rebuild configuration.

FIG. 8 illustrates a file system driven RAID rebuild configuration. In an embodiment, rebuild of the RAID configuration of the SSDs 260a-n, including the organization of data and parity information within RAID stripes 710, may be initiated by the layered file system when the segments 650a-c are cleaned, i.e., as extents are written to other segments. Each segment 650 may include one or more RAID stripes 710 which, in turn, may include segment chunks 620 from a set of SSDs 260a-n within a RAID group 810. More specifically, segments may include RAID stripes, RAID stripes may formed into segment chunks, and segment chunks may be located on SSDs. Note that a RAID group may include a subset of SSDs from a storage array 150, so that each segment 650a-c is associated with a corresponding RAID group 810a-c.

As noted, the data and parity information of the RAID configuration may be organized by segment such that the parity information may be distributed differently for each segment 650a-c of the storage array 150. For example, assume the storage array has 500 GB SSDs that are divided into 500 segments, wherein each segment has a 1 GB segment chunk and wherein a number of parity information chunk(s) is distributed among the SSDs by segment. A parity distribution pattern may be fixed for all of the stripes 710 of a segment, e.g., segment 650a, but that parity distribution pattern may change from segment to segment, e.g., from segment 650b to segment 650c. Such changing or differing patterns enable distribution of a read load for the RAID stripes (i.e., access pattern to SSDs having parity information) among the SSDs 260a-n of the storage array. As described further herein, when an SSD is added (e.g., as a replacement SSD for a failed SSD or as increased storage capacity), the parity distribution of new segments may include the added SSD.

Note that the number of segments should be sufficient in number (e.g., equal to at least the number of SSDs in the RAID group) to effectively distribute the read load among the SSDs, while simultaneously reducing the performance impact of the FTL by maintaining a sufficient size for each segment (i.e., a minimum RAID stripe depth), as previously described. In an embodiment, the parity may be distributed according to a run-time observed read load per SSD and, thus, the parity may be distributed dynamically as the system is used (i.e., as new segments are allocated). In this manner, the parity distribution is file system driven.

Each time a set of segment chunks 620 that make up a segment 710 is cleaned and reused (i.e., valid extents 610 of the segment are moved to another segment while deleted extents and holes are discarded), the layered file system may revisit the RAID configuration of the SSDs within the segment. This allows employment of all SSDs within a RAID group (and thus in the storage array) as part of a segment-by-segment RAID configuration without requiring use of SSDs as spares. Accordingly, an available pool of storage may include all SSDs in the storage array. That is, the storage system may avoid the use of spares for SSD replacement by allowing the existence of spare capacity anywhere in the data portion of the SSDs to be used for sparing after the loss of a SSD. Accordingly, an available pool of storage for data includes all SSDs without requiring one or more dedicated spare SSDs, because redundancy (e.g., RAID level) may be degraded on a segment-by-segment basis, rather than all at once. New segments may be configured with the same redundancy, but from a smaller set of SSDs after failure of a SSD (e.g., a segment having a 3+1 RAID organization may degrade to 3+0, but a new segment may then use a 2+1 RAID organization).

Figure 9:
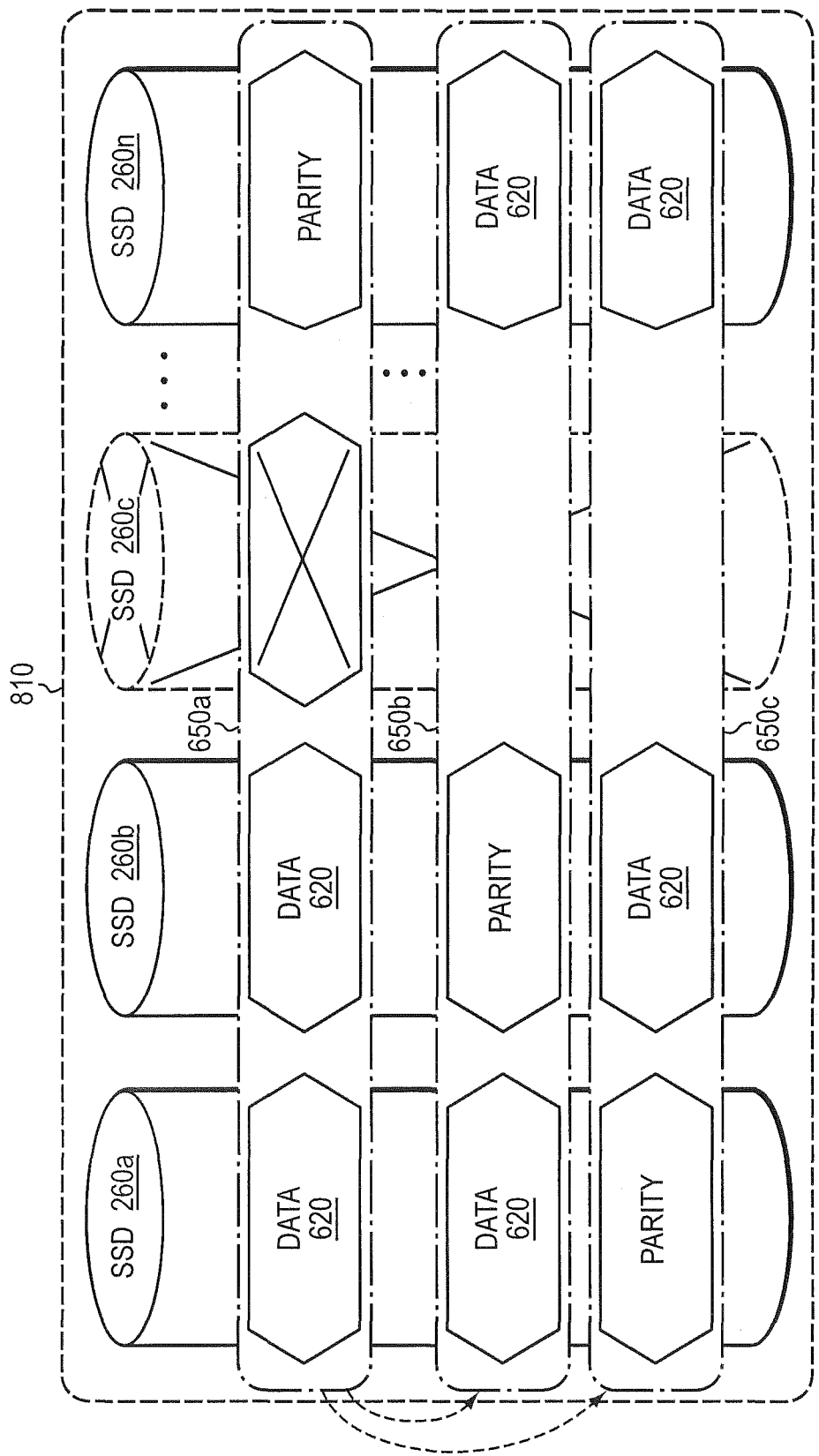
FIG. 9 illustrates a file system driven RAID rebuild configuration in response to a storage failure.

FIG. 9 illustrates a file system driven RAID rebuild configuration in response to a storage failure (e.g., a SSD failure). Assume a RAID group 810 having SSDs 260a-n is illustratively associated with a set of segments 650a-c such that the RAID organization is 3+1 (i.e., 3 data SSDs+1 parity SSD) and SSD 260c fails. Instead of reading data (i.e., segment chunks 620) and parity from the other SSDs 260 and creating another SSD (i.e., a spare SSD) that resembles the failed SSD 260c, segment cleaning may be applied to the segments that used the failed SSD. More generally, segment cleaning may be performed for each segment 650a-c that had a segment chunk 620 on the failed SSD 260c in order to reestablish the same level of redundancy prior to the failure. During segment cleaning, data is reconstructed as necessary when writing extents from the segment being cleaned to another segment. The valid data is written out to a new segment, which illustratively assumes a 2+1 (instead of a 3+1) RAID organization, because one of the SSDs (e.g., failed SSD 260c) is no longer part of the RAID group and there is no segment chunk contribution from that SSD. Accordingly, the failed SSD 260c may be removed from the RAID group when the new (i.e., clean) segment is allocated.

Figure 10:
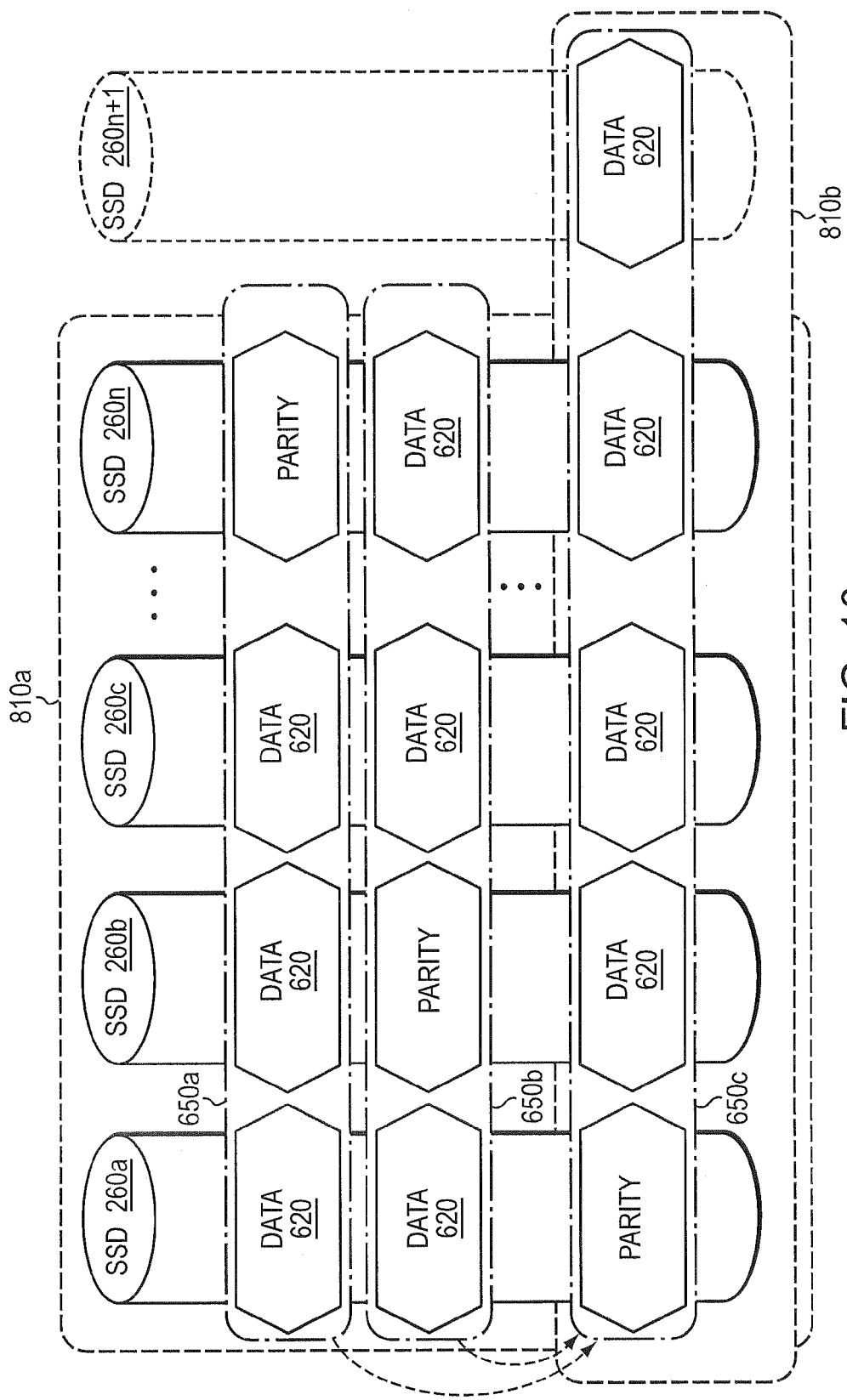
FIG. 10 illustrates a file system driven RAID rebuild configuration in response to addition of storage.

FIG. 10 illustrates a file system driven RAID rebuild configuration in response to addition of storage, e.g., as a replacement SSD for a failed SSD or as increased storage capacity. A new (i.e., additional or replacement) SSD 260n+1 may be added to the storage array such that existing segments 650a,b include SSDs 260a-n, while a new segment 650c includes SSDs 260a-n in addition to SSD 260n+1. As the segments 650a,b are cleaned, data is written (i.e., moved) from those segments to the segment 650c. A new RAID group 810b may be created once new segment 650c is allocated. The layered file system may then write extents to the new segment 650c with the additional capacity available for immediate use either to recover from a degraded level of redundancy or to store additional data.

In an embodiment, the file system driven RAID rebuild technique may not clean the segments in sequential order although all segments are cleaned over time. That is, segment cleaning may be driven based on which segments have the most available free space, while concurrently rebuilding degraded segments so that a failed SSD is retired from the configuration. Accordingly, the frequency of segment cleaning and the selection of segments to be cleaned may be based on (in addition to factors previously noted) whether segment chunks are resident on the failed SSD and a level of reserve space in the segments (i.e., free space maintained) of the RAID group. For example, if there is a desire to rebuild the failed SSD sooner, segment cleaning may be accelerated (e.g., started sooner with increased CPU resources). However, this may represent a poor trade-off, because additional capacity (i.e., a replacement SSD) contributes to the free space of prospective (i.e., new) segments, which are then inherently subject to more frequent cleaning and reuse (based on the aforementioned segment cleaning techniques). In this manner, file system driven RAID rebuild may be accelerated.

Assume there are initially 22 data SSDs of a RAID group having 25% of reserve space (i.e., an amount of storage consumed by free segments as a fraction of storage capacity within the RAID group) when a single SSD fails. Upon completion of segment cleaning, there are 21 data SSDs of the RAID group having approximately 21% (or more due to cleaning deleted extents) of reserve space, where a capacity of the failed SSD is removed from reserve space. Note, the fractional loss of reserve space from a SSD failure for a small pool of SSDs (i.e., a small RAID group) may reduce the reserve space below a desired threshold (e.g., 7%), thus requiring aggressive (e.g., immediate) cleaning of segments within the pool to maintain the desired reserve space level. However, for a sufficiently large pool of SSDs (i.e., a large RAID group) having N SSDs, some loss of reserve space (e.g., failure of a single SSD) may be tolerated when a resulting reserve space, i.e., reserve space−1/N (e.g., 25%−1/22≈20.5%), remains above the reserve space threshold (e.g., 7%). Alternatively, the capacity of the failed drive may be removed evenly from reserve and non-reserve space (i.e., end-user capacity) yielding a reserve space of (N−1)/N× prior reserve space (e.g., 21/22×25%≈23.9%). Advantageously, the file system RAID rebuild technique described herein avoids having dedicated spare storage capacity (e.g., spare SSDs), but at the cost of additional write amplification due to more frequent cleaning of segments caused by the lower amount of available free space (i.e., reserve space) within the pool of storage. Notably, the threshold of reserve space may be determined based on a threshold of write amplification. That is, various embodiments trade-off either (i) the same capacity with lower write amplification (i.e., a higher reserve space threshold) or (ii) the same write amplification with a higher capacity (i.e., a lower reserve space threshold).

For example, assume further a true dedicated spare SSD arrangement having a 21+2+1 RAID organization (i.e., 21 data SSDs, 2 parity SSDs, and 1 spare SSD) of a 24 SSD RAID group. A portion (i.e., $\frac{1}{24}^{th}$ or ≈4%) of each SSD may be dedicated as the "spare SSD" such that the portions collectively form a fixed region which is not available for writing (i.e., a spare SSD reserved for a failure). After a single SSD fails, the stripe width is still 21+2, and if the 4% "spare SSD" portions are distributed at fixed locations on each SSD, the missing data for the failed SSD may be reconstituted by relocating that data to the spare capacity on each of the other SSD. However, this arrangement has the disadvantage of not contributing the fixed region as spare capacity to the reserve space (i.e., free space). Thus, the spare capacity is (i) unavailable for segment cleaning, thereby increasing write amplification, and is (ii) unavailable to reduce read load from additional parity distribution, thereby reducing performance.

Temporary Storage Failure

The file system driven RAID rebuild technique described herein may be applied to a SSD that temporarily fails (i.e., goes offline) for a short period of time, e.g., a couple of minutes, and then comes back (i.e., the SSD is unavailable for only the short period of time). New write requests to segments of a RAID group may omit the unavailable SSD (e.g., RAID stripes operate as if degraded) for that time period as the requests are received and processed by the layered file system. Subsequently, when the SSD recovers (i.e., comes back online), there is no need to reconstruct any data on the SSD as the SSD has not been the target of the new write requests (i.e., RAID stripes consider the SSD as failed and do not write to it). Note that if a segment is written that has parity on the SSD that temporarily fails, the parity may be recreated after the SSD comes back online by cleaning the segment. Alternatively, a different segment may be used for that portion of the segment (i.e., chunks) being written while the SSD is offline, so that the SSD is not used. In either embodiment, after the SSD temporarily fails and recovers, any segment that was actively being written at the time that the SSD went offline may be reconstructed by segment cleaning (i.e., degraded segments are cleaned). In an alternative embodiment, parity may be re-distributed in the segment(s) actively being written while the SSD is offline, so that no redundancy is lost for data written during that period. Notably, this capability permits placement of multiple SSDs in a single carrier while allowing temporary removal of functioning SSDs in the carrier.

In an embodiment, after the temporarily failed SSD returns online, segment cleaning may be promptly initiated because, while the SSD was offline, there may have been writes in-flight that included the SSD (i.e., segment chunks directed to the SSD while offline). However, rather than rewrite the in-flight data to the SSD immediately upon recovery of the SSD (i.e., the SSD coming online), the SSD may be marked as degraded during its offline period. When the SSD is back online, the segment containing the previously in-flight data may be cleaned, so that the data returns to full redundancy. Alternatively, the in-flight data may be rewritten immediately when the SSD temporarily fails, thus eliminating the unavailable SSD from the RAID group and redistributing the parity within the segment to exclude that SSD.

In an embodiment, a decision to eliminate the SSD from the RAID group may be postponed for an expected "offline" time, i.e., an expected time period for such a type of SSD to temporarily go offline. Once it is determined that the SSD is permanently unavailable, the SSD may be removed from the RAID group and eliminated from write allocations to existing or new segments. Accordingly, cleaning of the other segments may be postponed in order to fully restore redundancy. Nevertheless, in another embodiment, segment cleaning may begin immediately once it is determined that the SSD is permanently offline. If the SSD subsequently returns online, such recovery may be stopped since the segments that have yet to be cleaned are still valid. Therefore, the decision whether to fail the SSD may depend on when it is appropriate to begin absorbing the cost of reconstructing the RAID redundancy (including cleaning all segments), assuming that the SSD is likely unavailable based on the expected time for the type of SSD to be temporarily offline. There may be software and/or firmware actions (e.g., an attempted power-on of the SSD) taken to resuscitate the SSD (i.e., restore the SSD to normal operating parameters). For a heavily-loaded system, e.g., greater than 70% of a maximum number of I/Os per second (IOPS) of the system, it may be desirable to delay RAID reconstruction, whereas for a lightly-loaded system (e.g., less than 30% of the maximum system TOPS), reconstruction may begin promptly. In an embodiment, reconstruction may be delayed to an expected off hours period (i.e., a period where users are expected to only lightly load the storage system), but with the comitant risk of losing additional redundancy during the delay. Illustratively, a simple policy may be to start reconstruction after several minutes (e.g., 3 minutes) of attempting to resuscitate the failed SSD.

For example, assume that a combination read/write of a GB/sec is performed to segment clean 10,000 GB of storage. Such segment cleaning may require 10,000 seconds to read the storage and 10,000 seconds to write the storage for a total time of approximately 3 hours. Waiting 3 minutes to begin reconstruction may not significantly affect overall availability. If the SSD comes back online an hour after the start of reconstruction, the reconstruction operation (i.e., rebuild by segment cleaning) may be aborted and the storage system may continue to use the data from the SSD that has not been implicitly cleaned (i.e., extents relocated to another SSD) while the SSD was offline. The decision to start reconstruction may be rendered in response to failure of the resuscitation procedure and the relative time to wait as compared to the reconstruction duration, as well as the amount of overhead associated with the reconstruction.

The foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as software encoded on a tangible (non-transitory) computer-readable medium (e.g., disks and/or CDs) having program instructions executing on a computer, hardware, firmware, or a combination thereof. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. A system comprising:
   a central processing unit (CPU) of a node;
   one or more storage arrays of solid state drives (SSDs) coupled to the node, each storage array including a plurality of segments, the SSDs organized as one or more redundant array of independent disks (RAID) groups configured to provide data redundancy for the segments; and
   a memory coupled to the CPU and configured to store a layered file system of a storage input/output (I/O) stack, the layered file system configured to perform segment cleaning to consolidate fragmented free space of a first segment by copying data from the first segment to a second segment, the layered file system further configured to initiate the segment cleaning of the first segment having a RAID configuration including a temporarily failed SSD in response to recovery of the temporarily failed SSD, wherein the RAID configuration is rebuilt for the second segment in response to the segment cleaning of the first segment, and wherein data in-flight to the temporarily failed SSD is discarded while the temporarily failed SSD is offline rather than rewritten when the temporarily failed SSD recovers.

2. The system of claim 1 wherein each segment includes one or more RAID stripes configured to provide a level of data redundancy as well as RAID organization for the segment, and wherein the level of data redundancy and the RAID organization differ among the segments.

3. The system of claim 2 wherein the level of data redundancy includes one of single parity RAID 5 and double parity RAID 6.

4. The system of claim 2 wherein the RAID organization comprises distribution of data and parity among the SSDs of the segment.

5. The system of claim 4 wherein the distribution of the parity includes different parity locations on the SSDs for different segments.

6. The system of claim 4 wherein the distribution of the parity includes a first set of fixed parity SSDs for the first segment and a second set of fixed parity SSDs for the second segment different from the first segment, and wherein the first set of fixed parity SSDs is different from the second set of fixed parity SSDs.

7. The system of claim 4 wherein the distribution of parity is realized on a segment-by-segment basis with a fixed parity arrangement within each segment.

8. A method comprising:
   organizing one or more storage arrays of solid state drives (SSDs) that include a plurality of segments as one or more redundant array of independent disks (RAID) groups, the RAID groups configured to provide data redundancy for the segments;
   performing, by a node executing a layered file system of a storage input/output (I/O) stack, segment cleaning to consilidate fragmented free space of a first segment by copying data from the first segment to a second segment; and
   initiating the segment cleaning of the first segment having a RAID configuration including a temporarily failed SSD in response to recovery of the temporarily failed SSD,
   wherein the RAID configuration is rebuilt for the second segment in response to the segment cleaning of the first segment, and wherein data in-flight to the temporarily failed SSD is discarded while the temporarily failed SSD is offline rather than rewritten when the temporarily failed SSD recovers.

9. The method of claim 8 wherein each segment includes one or more RAID stripes configured to provide a level of data redundancy as well as RAID organization for the segment, and wherein the level of data redundancy and the RAID organization differ among the segments.

10. The method of claim 9 wherein the level of data redundancy includes one of single parity RAID 5 and double parity RAID 6.

11. The method of claim 9 further comprising:
    distributing data and parity among the SSDs of the segment as part of the RAID configuration.

12. The method of claim 11 wherein the distributing data and parity further comprises:
    using different parity locations on the SSDs for different segments.

13. The method of claim 11 wherein the distributing data and parity further comprises:
    using a first set of fixed parity SSDs for the first segment and a second set of fixed parity SSDs for the second segment different from the first segment, wherein the first set of fixed parity SSDs is different from the second set of fixed parity SSDs.

14. The method of claim 8 wherein the distributing data and parity is performed on a segment-by-segment basis with a fixed parity arrangement within each segment.

15. A non-transitory computer readable medium including program instructions for execution on one or more processors, the program instructions when executed operable to:
    organize one or more storage arrays of solid state drives (SSDs) that include a plurality of segments as one or more redundant array of independent disks (RAID) groups, the RAID groups configured to provide data redundancy for the segments;
    perform segment cleaning to consolidate fragmented free space of a first segment by copying data from the first segment to a second segment; and
    initiate the segment cleaning of the first segment having a RAID configuration including a temporarily failed SSD in response to recovery of the temporarily failed SSD,
    wherein the RAID configuration is rebuilt for the second segment in response to the segment cleaning of the first segment, and wherein data in-flight to the temporarily failed SSD is discarded while the temporarily failed SSD is offline rather than rewritten when the temporarily failed SSD recovers.

16. The non-transitory computer readable medium of claim 15 wherein each segment includes one or more RAID stripes configured to provide a level of data redundancy as well as RAID organization for the segment, and wherein the level of data redundancy and the RAID organization differ among the segments.

17. The non-transitory computer readable medium of claim 16 wherein the level of data redundancy includes one of single parity RAID 5 and double parity RAID 6.

18. The non-transitory computer readable medium of claim 16 wherein the RAID organization comprises distribution of data and parity among the SSDs of the segment.

19. The non-transitory computer readable medium of claim 18 wherein the distribution of the parity includes different parity locations on the SSDs for different segments.

20. The non-transitory computer readable medium of claim 18 wherein the distribution of the parity includes a first set of fixed parity SSDs for the first segment and a second set of fixed parity SSDs for the second segment different from the first segment, wherein the first set of fixed parity SSDs is different from the second set of fixed parity SSDs.

* * * * *

UNITED STATES PATENT AND TRADEMARK OFFICE
CERTIFICATE OF CORRECTION

PATENT NO. : 9,454,434 B2  
APPLICATION NO. : 14/158448  
DATED : September 27, 2016  
INVENTOR(S) : Sundaram et al.

Page 1 of 1

It is certified that error appears in the above-identified patent and that said Letters Patent is hereby corrected as shown below:

In the Specification  
Column 19, Line 49:  
Delete "system TOPS), reconstruction may begin promptly. In an"  
Insert --system IOPS), reconstruction may begin promptly. In an--

In the Claims  
Claim 8, Column 21, Line 9:  
Delete "consilidate fragmented free space of a first segment by"  
Insert --consolidate fragmented free space of a first segment by--

Signed and Sealed this  
Twenty-third Day of May, 2017

Michelle K. Lee  
*Director of the United States Patent and Trademark Office*